US012660265B2

(12) United States Patent
Choi et al.

(10) Patent No.:  US 12,660,265 B2
(45) Date of Patent:  Jun. 16, 2026

(54) SEMICONDUCTOR DEVICE INCLUDING RECESSED SIDEWALL

(71) Applicant: Samsung Electronics Co., Ltd., Suwon-si (KR)

(72) Inventors: Jae Young Choi, Suwon-si (KR); Mincheol Oh, Suwon-si (KR); Wooseok Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 322 days.

(21) Appl. No.: 18/355,548

(22) Filed: Jul. 20, 2023

(65) Prior Publication Data

US 2024/0194733 A1      Jun. 13, 2024

(30) Foreign Application Priority Data

Dec. 12, 2022    (KR) ........................ 10-2022-0173023

(51) Int. Cl.

| | |
|---|---|
| *H10D 62/10* | (2025.01) |
| *H10D 30/01* | (2025.01) |
| *H10D 30/43* | (2025.01) |
| *H10D 30/62* | (2025.01) |
| *H10D 30/67* | (2025.01) |
| *H10D 62/13* | (2025.01) |
| *H10D 84/01* | (2026.01) |

(Continued)

(52) U.S. Cl.
CPC ........... *H10D 62/121* (2025.01); *H10D 30/43* (2025.01); *H10D 30/6735* (2025.01); *H10D 30/6757* (2025.01); *H10D 62/151* (2025.01); *H10D 84/85* (2025.01); *H10W 20/20* (2026.01)

(58) Field of Classification Search
CPC .. H10D 62/121; H10D 30/43; H10D 30/6757; H10D 30/014; H10D 30/6735; H10D 84/853; H10D 30/62; H10D 84/85; H10W 20/20; H01L 23/5286; H01L 23/5226
See application file for complete search history.

(56) References Cited

U.S. PATENT DOCUMENTS

| | | |
|---|---|---|
| 6,214,496 B1 | 4/2001 | Carpio et al. |
| 9,116,432 B2 | 8/2015 | Ndoye et al. |

(Continued)

FOREIGN PATENT DOCUMENTS

| | | |
|---|---|---|
| KR | 20180073791 A | 7/2018 |
| KR | 20220022576 A | 2/2022 |

*Primary Examiner* — Sonya McCall-Shepard
(74) *Attorney, Agent, or Firm* — Harness, Dickey & Pierce, P.L.C.

(57)      ABSTRACT

A semiconductor device includes an active pattern on a substrate, source/drain patterns on the active pattern, channel patterns on the active pattern and connected to the source/drain patterns each including stacked semiconductor patterns, gate electrodes on the channel patterns and extending in parallel to each other in a first direction, and a power line adjacent to the active pattern. The power line extends in a second direction. The active pattern includes a first region having a first width, a second region having a second width, and a third region between the first and second regions. The first region has a first sidewall extending in the second direction. The second region has a second sidewall extending in the second direction. The third region has a recessed sidewall that connects the first and second sidewalls. The recessed sidewall is recessed toward the power line.

20 Claims, 30 Drawing Sheets

(51)  Int. Cl.
    *H10D 84/03*        (2025.01)
    *H10D 84/85*        (2025.01)
    *H10W 20/20*        (2026.01)

(56)  References Cited

U.S. PATENT DOCUMENTS

| | | |
|---|---|---|
| 9,904,163 B2 | 2/2018 | Ho et al. |
| 10,684,544 B2 | 6/2020 | Choi et al. |
| 10,922,472 B2 | 2/2021 | Kang et al. |
| 11,158,509 B2 | 10/2021 | Shen et al. |
| 2021/0375807 A1 | 12/2021 | Wallace et al. |

M1_R (VDD)   M1_I   M1_R (VSS)   M2_I

ACL
(AP1)

RSW

SS1

D1

D2

D3

M          RG3          M'

PP

SS3

SKT          ISW

ACL
(AP2)

SS4

D1

D2

D3

N          RG3          N'

SEMICONDUCTOR DEVICE INCLUDING RECESSED SIDEWALL

CROSS-REFERENCE TO RELATED APPLICATION

This U.S. nonprovisional application claims priority under 35 U.S.C § 119 to Korean Patent Application No. 10-2022-0173023 filed on Dec. 12, 2022 in the Korean Intellectual Property Office, the disclosure of which is hereby incorporated by reference in its entirety.

BACKGROUND

Various example embodiments relate to a semiconductor device and/or a method of fabricating the same, and more particularly, to a semiconductor device including a field effect transistor and/or a method of fabricating the same.

A semiconductor device may include an integrated circuit including metal oxide semiconductor field effect transistors (MOSFETs). As sizes and/or design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having superior performances while overcoming or at least partially mitigating limitations caused by high integration of the semiconductor devices.

SUMMARY

Some example embodiments provide a semiconductor device with increased reliability and improved electrical properties.

Some example embodiments provide a method of fabricating a semiconductor device with increased reliability and improved electrical properties.

According to some example embodiments, a semiconductor device may include an active pattern on a substrate, a plurality of source/drain patterns on the active pattern, a plurality of channel patterns on the active pattern and connected to the plurality of source/drain patterns, each of the plurality of channel patterns including a plurality of semiconductor patterns that are vertically stacked and spaced apart from each other, and a plurality of gate electrodes correspondingly on the plurality of channel patterns, the plurality of gate electrodes extending in parallel to each other in a first direction; and a power line adjacent to the active pattern. The power line may extend in a second direction that intersects the first direction. The active pattern may include a first region having a first width, a second region having a second width less than the first width, and a third region between the first region and the second region. The first region may have a first sidewall that extends in the second direction. The second region may have a second sidewall that extends in the second direction. The third region may have a recessed sidewall that connects the first sidewall and the second sidewall to each other. The recessed sidewall may be recessed toward the power line.

Alternatively or additionally according to some example embodiments, a semiconductor device may include a first active pattern and a second active pattern that are on a substrate, each of the first and second active patterns including a first region having a first width, a second region having a second width less than the first width, and a third region between the first region and the second region; a first source/drain pattern and a first channel pattern on the third region of the first active pattern, a second source/drain pattern and a second channel pattern that are on the third region of the second active pattern and a gate electrode on the first channel pattern and the second channel pattern. The gate electrode may extend in a first direction from the second active pattern to the first active pattern. The third region of the first active pattern may have a recessed sidewall of a concave profile. The third region of the second active pattern may have an inclined sidewall of a convex profile.

Alternatively or additionally according to some example embodiments, a semiconductor device may comprise: an active pattern on a substrate; a device isolation layer that at least partly fills a trench defining the active pattern; a source/drain pattern on the active pattern, a channel pattern on the active pattern and connected to the source/drain pattern, the channel pattern including a plurality of semiconductor patterns that are vertically stacked and spaced apart from each other, a gate electrode on the channel pattern, the gate electrode extending in a first direction and including a plurality of inner electrodes between the plurality of semiconductor patterns and an outer electrode on the plurality of semiconductor patterns, a gate dielectric layer between the gate electrode and the channel pattern, a gate spacer on a sidewall of the gate electrode, a gate capping pattern on a top surface of the gate electrode; an interlayer dielectric layer on the gate capping pattern, an active contact that penetrates the interlayer dielectric layer to come into electrical connection with the source/drain pattern, a metal-semiconductor compound layer between the active contact and the source/drain pattern; a gate contact that penetrates the interlayer dielectric layer and the gate capping pattern to come into electrical connection with the gate electrode, a first metal layer on the interlayer dielectric layer, the first metal layer including a plurality of first wiring lines that are correspondingly electrically connected to the active contact and the gate contact, and a second metal layer on the first metal layer. The second metal layer may include a plurality of second wiring lines electrically connected to the first metal layer. The active pattern may include a first region having a first width, a second region having a second width less than the first width, and a third region between the first region and the second region. A third width of the third region may decrease and then increase in a direction from the first region toward the second region.

BRIEF DESCRIPTION OF THE DRAWINGS

Figure 15:
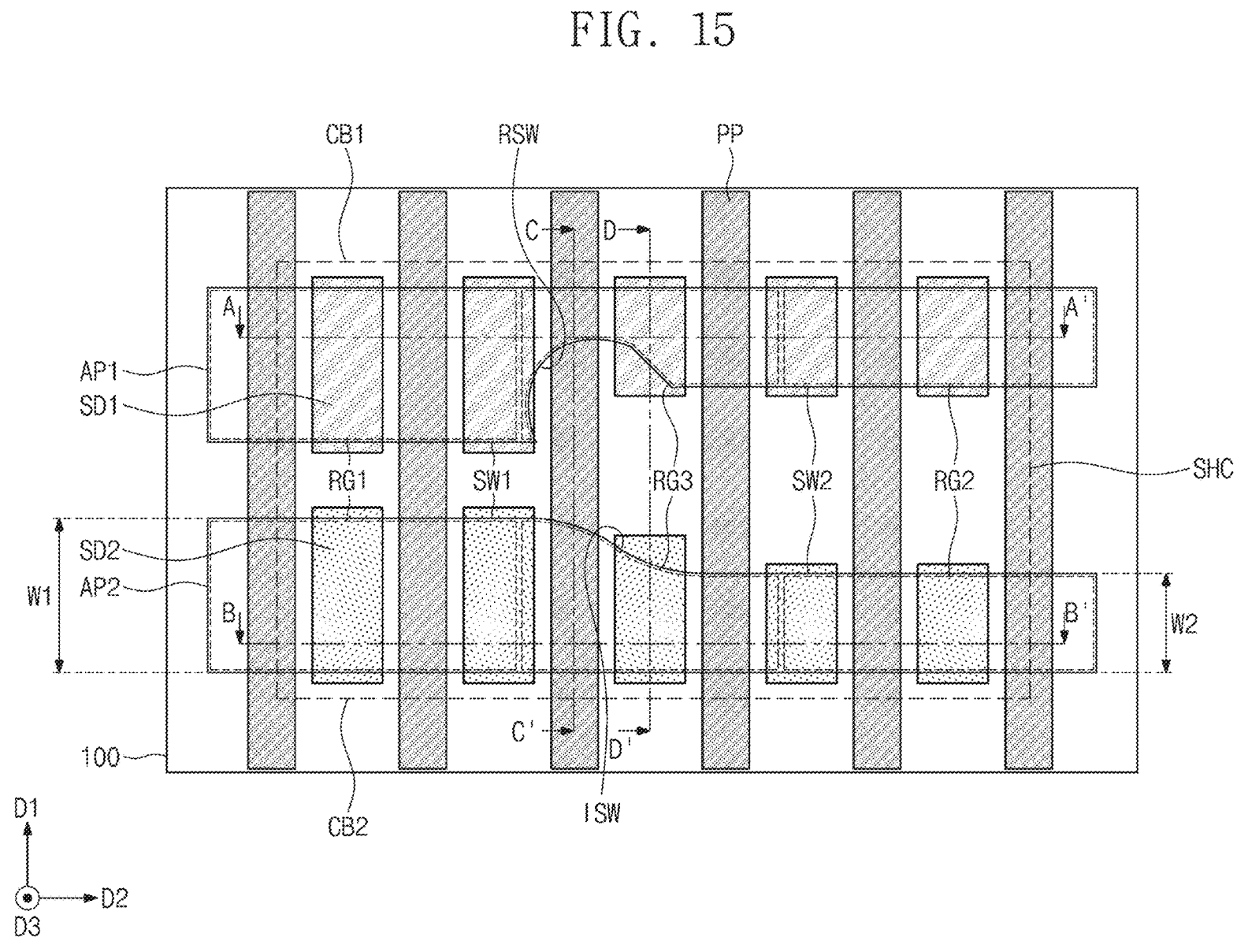
Figure 13:
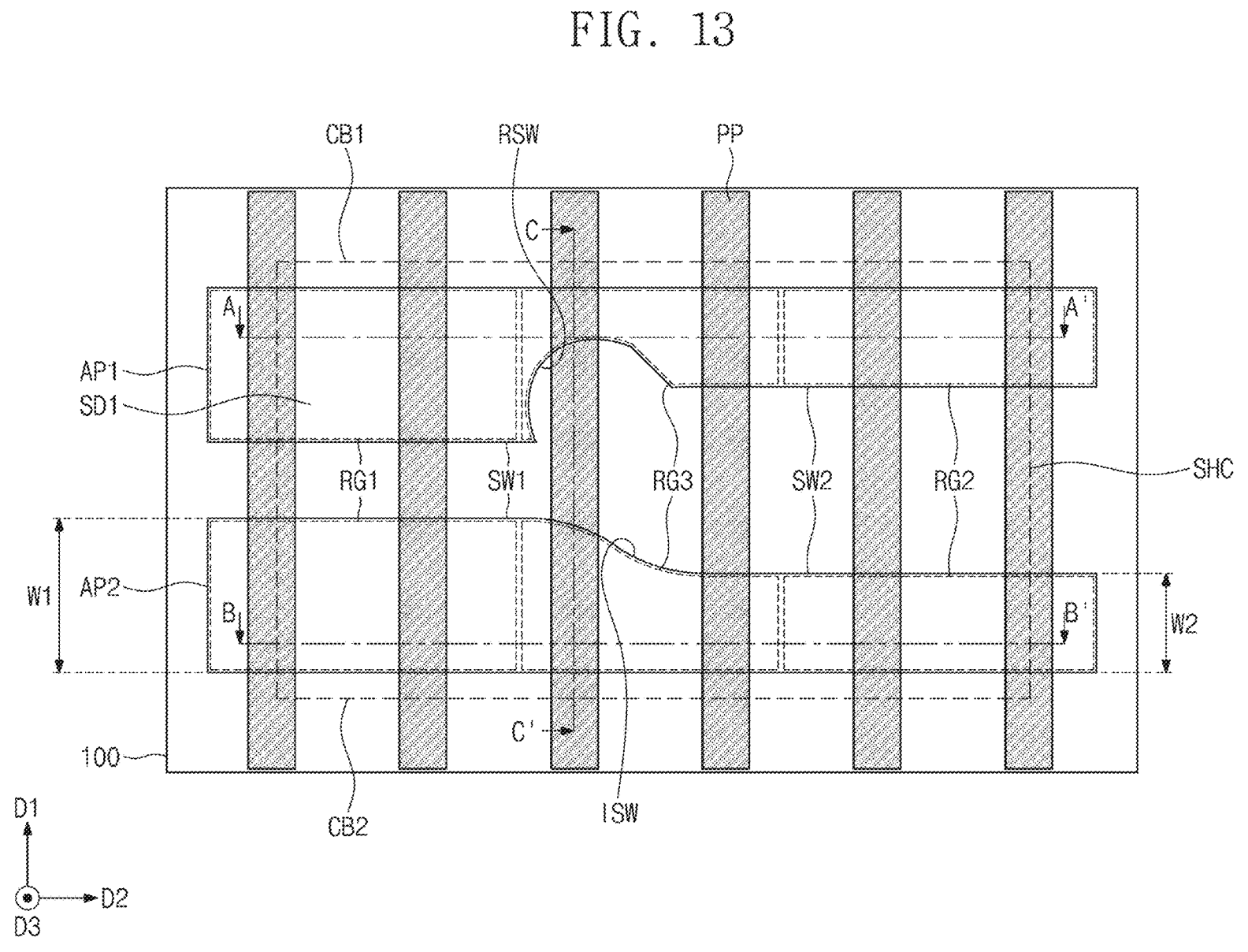

FIGS. 7, 9, 11, 13, and 15 illustrate plan views showing a method of fabricating a semiconductor device according to some example embodiments.

DETAIL PARTED DESCRIPTION OF VARIOUS EXAMPLE EMBODIMENTS

Figure 1:
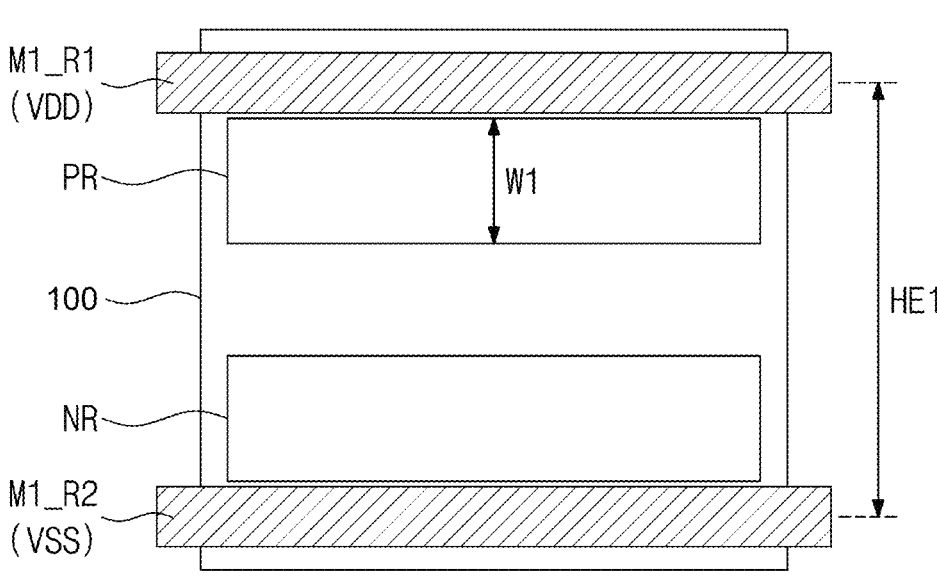
FIGS. 1 to 3 illustrate conceptual views showing logic cells of a semiconductor device according to some example embodiments.
Figure 1:
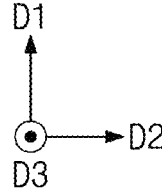
Figure 2:
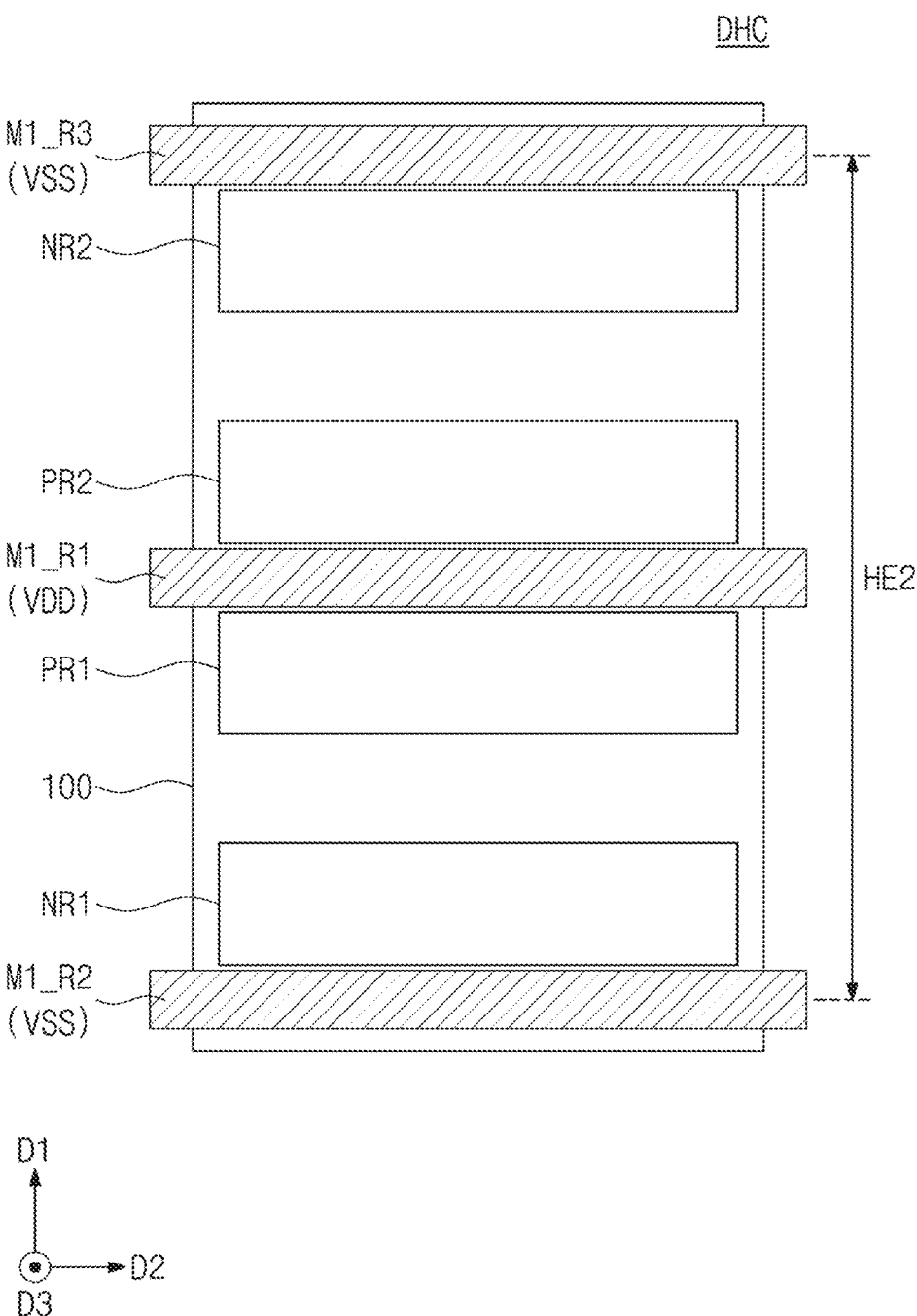
Figure 3:
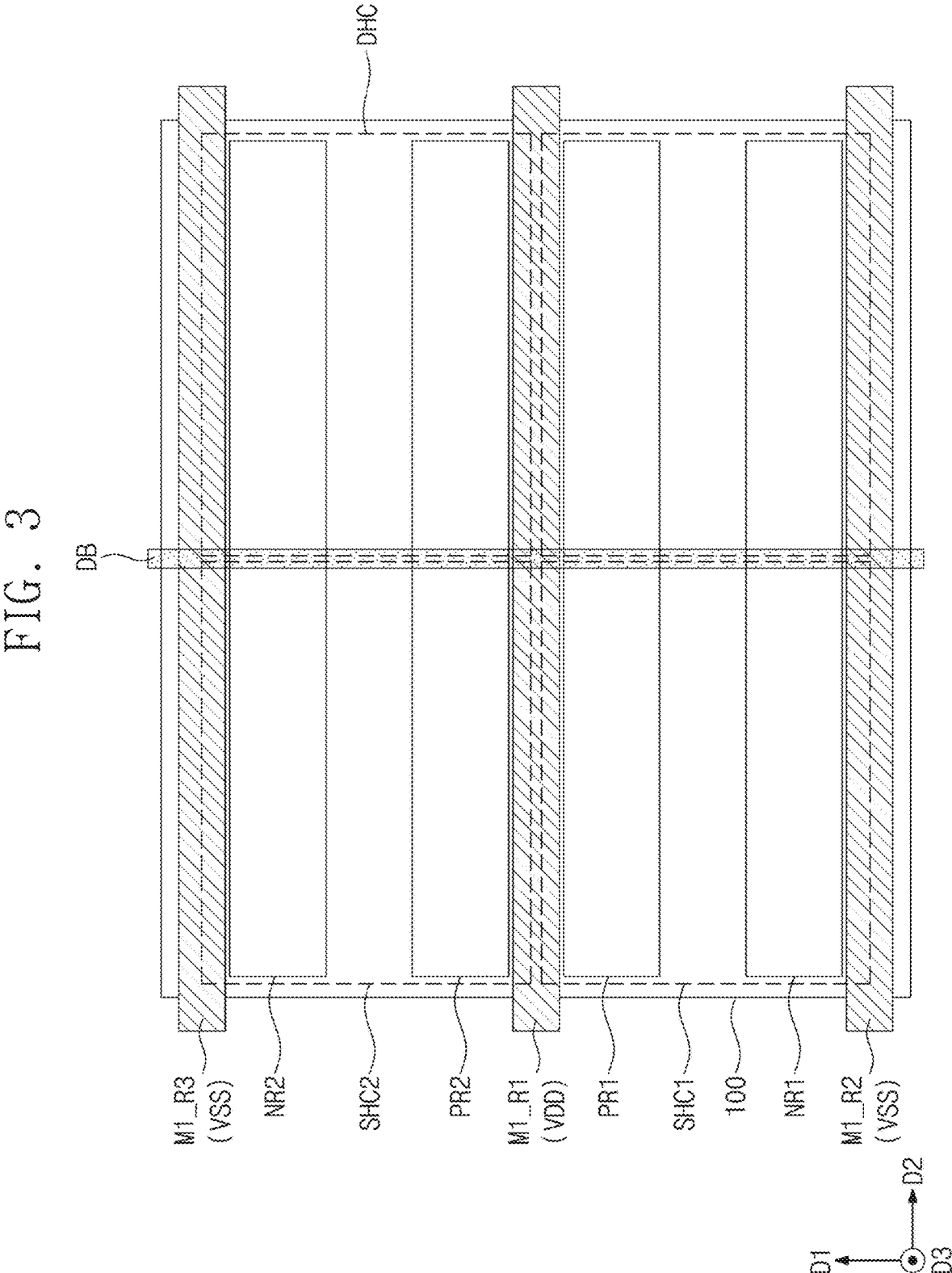

FIGS. 1 to 3 illustrate conceptual views showing logic cells of a semiconductor device according to some example embodiments. FIGS. 1 to 3 may be plan views showing standard logic cells.

Referring to FIG. 1, a single height cell SHC may be provided. For example, a substrate 100 may be provided thereon with a first power line M1_R1 and a second power line M1_R2. The first power line M1_R1 may be or may correspond to a path for providing a volage such as a drain voltage VDD, for example, a power voltage. The second power line M1_R2 may be a path for providing another voltage such as source voltage VSS, for example, a ground voltage.

The single height cell SHC may be defined between the first power line M1_R1 and the second power line M1_R2. The single height cell SHC may include one (e.g., only one) PMOSFET region PR and one (e.g., only one) NMOSFET region NR. For example, the single height cell SHC may have a complementary metal oxide semiconductor (CMOS) structure provided between the first power line M1_R1 and the second power line M1_R2.

Each of the PMOSFET and NMOSFET regions PR and NR may have a first width W1 in a first direction D1 (e.g., a first horizontal direction D1), which may or may not be the same between the PMSOFET region PR and the NMOSFET region NR. A first height HE1 may be defined as a length in the first direction D1 of the single height cell SHC. The first height HE1 may be substantially the same as a distance (e.g., pitch) between the first power line M1_R1 and the second power line M1_R2.

The single height cell SHC may constitute one, e.g., only one, logic cell. In this description, the logic cell may mean a logic device, such as AND, OR, XOR, XNOR, AOI, MUX, and inverter, that performs a specific function. For example, the logic cell may include transistors such as NMOS and/or PMOS transistors for constituting a logic device, and may also include wiring lines that connect the transistors to each other.

Referring to FIG. 2, a double height cell DHC may be provided. For example, a substrate 100 may be provided thereon with a first power line M1_R1, a second power line M1_R2, and a third power line M1_R3. The first power line M1_R1 may be disposed between the second power line M1_R2 and the third power line M1_R3. The third power line M1_R3 may be a path for providing a drain voltage VDD.

The double height cell DHC may be defined between the second power line M1_R2 and the third power line M1_R3. The double height cell DHC may include two PMOSFET regions (e.g., exactly two PMOSFET regions) including a first PMOSFET region PR1 and a second PMOSFET region PR2, and may include two NMOSFET regions (e.g., exactly two NMOSFET regions including a first NMOSFET region NR1, and a second NMOSFET region NR2.

The first NMOSFET region NR1 may be adjacent to or abutted with the second power line M1_R2. The second NMOSFET region NR2 may be adjacent to or abutted with the third power line M1_R3. The first and second PMOSFET regions PR1 and PR2 may be adjacent to or abutted with the first power line M1_R1. When viewed in plan, the first power line M1_R1 may be disposed between the first and second PMOSFET regions PR1 and PR2.

A second height HE2 may be defined to indicate a length in the first direction D1 of the double height cell DHC. The second height HE2 may be about twice the first height HE1 of FIG. 1. The first and second PMOSFET regions PR1 and PR2 of the double height cell DHC may collectively operate as a single PMOSFET region.

Therefore, the double height cell DHC may have a PMOS transistor whose channel size or channel width is greater than that of a PMOS transistor included in the single height cell SHC discussed above in FIG. 1. For example, the channel size or channel width of the PMOS transistor included in the double height cell DHC may be about twice that of the PMOS transistor included in the single height cell SHC. In conclusion, the double height cell DHC may operate at a higher speed than that of the single height cell SHC. In some example embodiments, the double height cell DHC shown in FIG. 2 may be defined as a multi-height cell. Although not shown, the multi-height cell may include a triple height cell whose cell height is about three times that of the single height cell SHC.

Referring to FIG. 3, a substrate 100 may be provided thereon with a first single height cell SHC1, a second single height cell SHC2, and a double height cell DHC that are two-dimensionally disposed. The first single height cell SHC1 may be disposed between a first power line M1_R1 and a second power line M1_R2. The second single height cell SHC2 may be disposed between the first power line M1_R1 and a third power line M1_R3. The second single height cell SHC2 may be adjacent in a first direction D1 to the first single height cell SHC1.

The double height cell DHC may be disposed between the second power line M1_R2 and the third power line M1_R3. The double height cell DHC may be adjacent in a second direction D2 to the first and second single height cells SHC1 and SHC2.

A diffusion break or separation structure DB may be provided between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4:
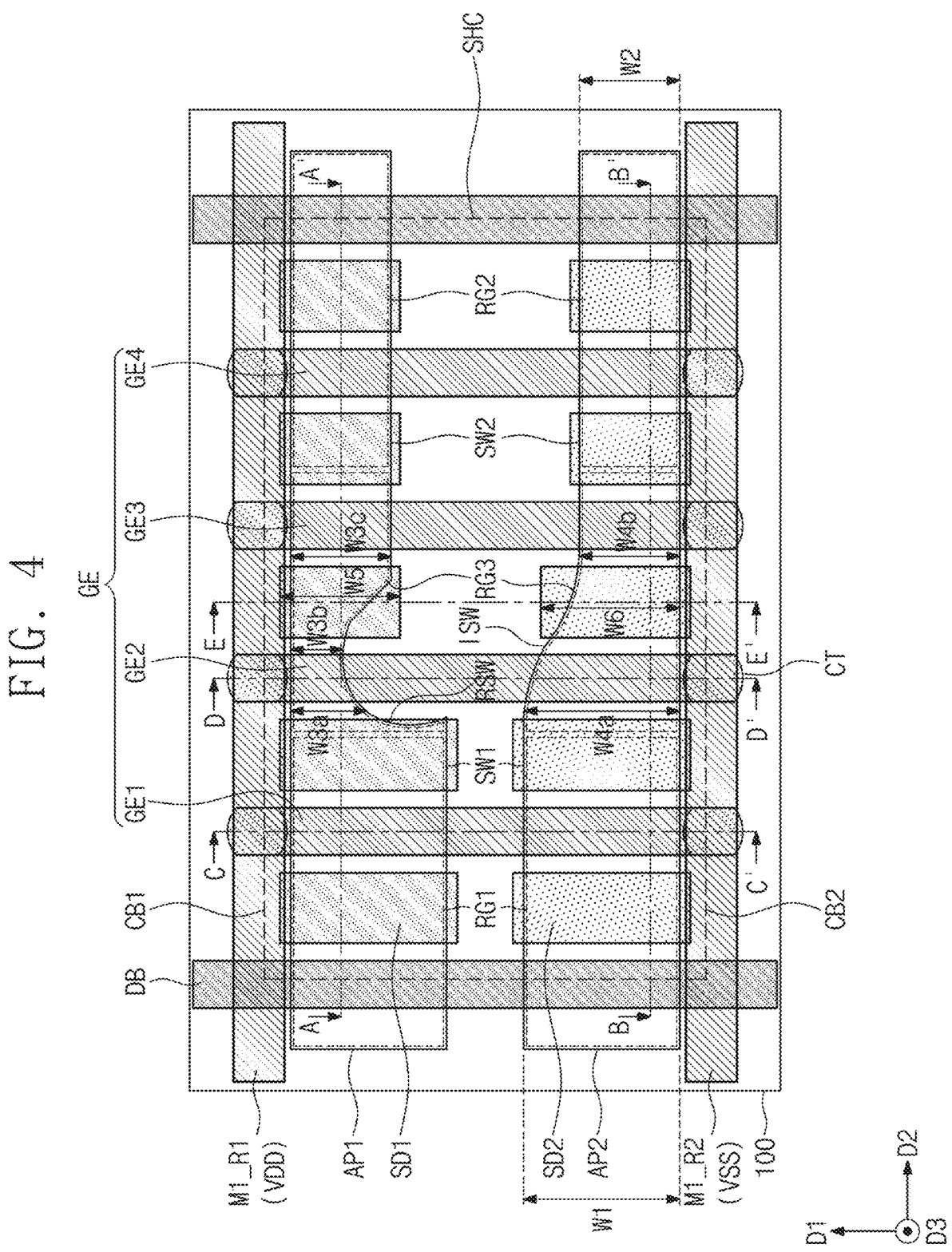
FIG. 4 illustrates a plan view showing a semiconductor device according to some example embodiments.
Figure 5A:
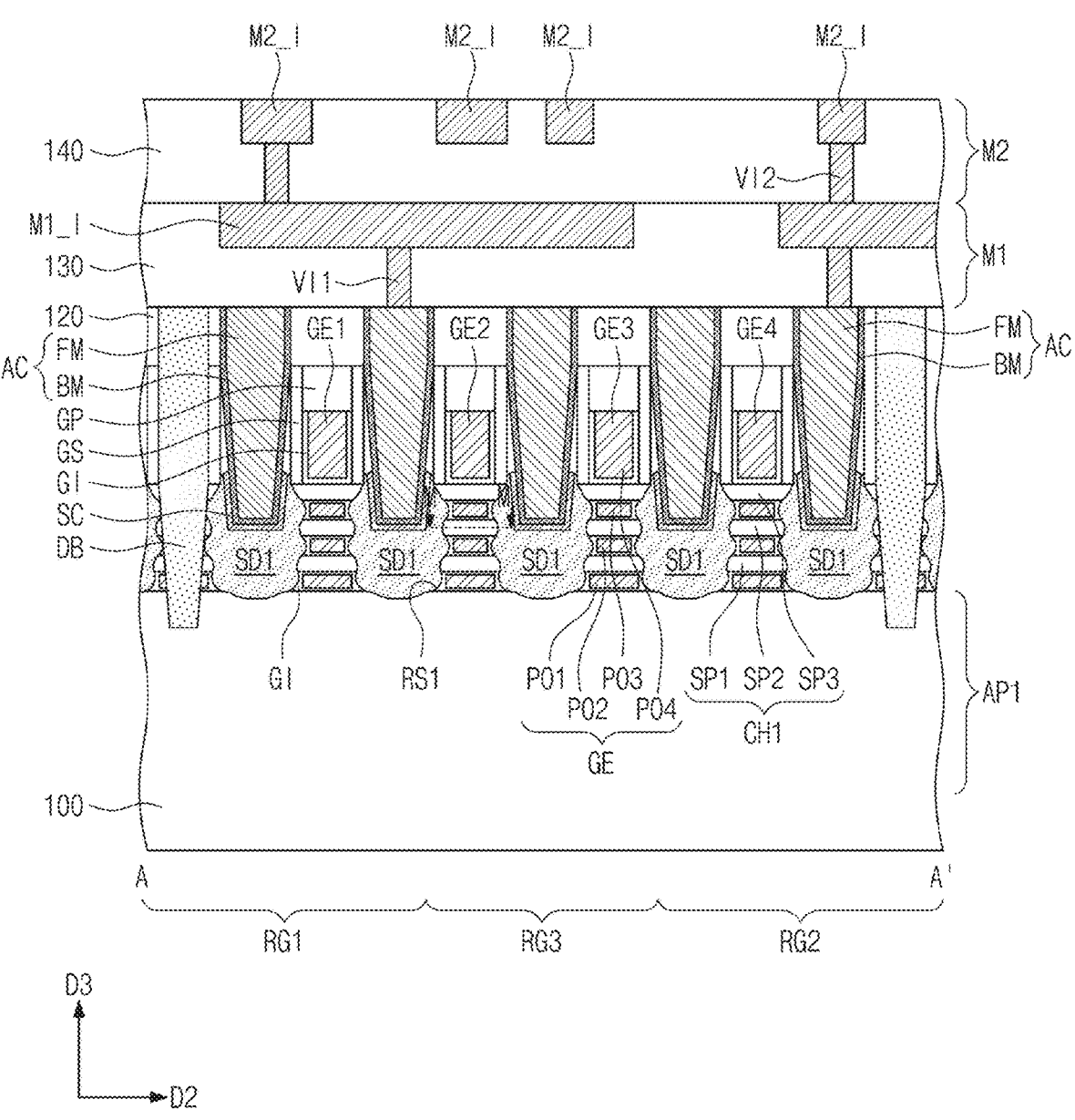
FIGS. 5A, 5B, 5C, 5D, and 5E illustrate cross-sectional views respectively taken along lines A-A', B-B', C-C', D-D', and E-E' of FIG. 4.
Figure 5B:
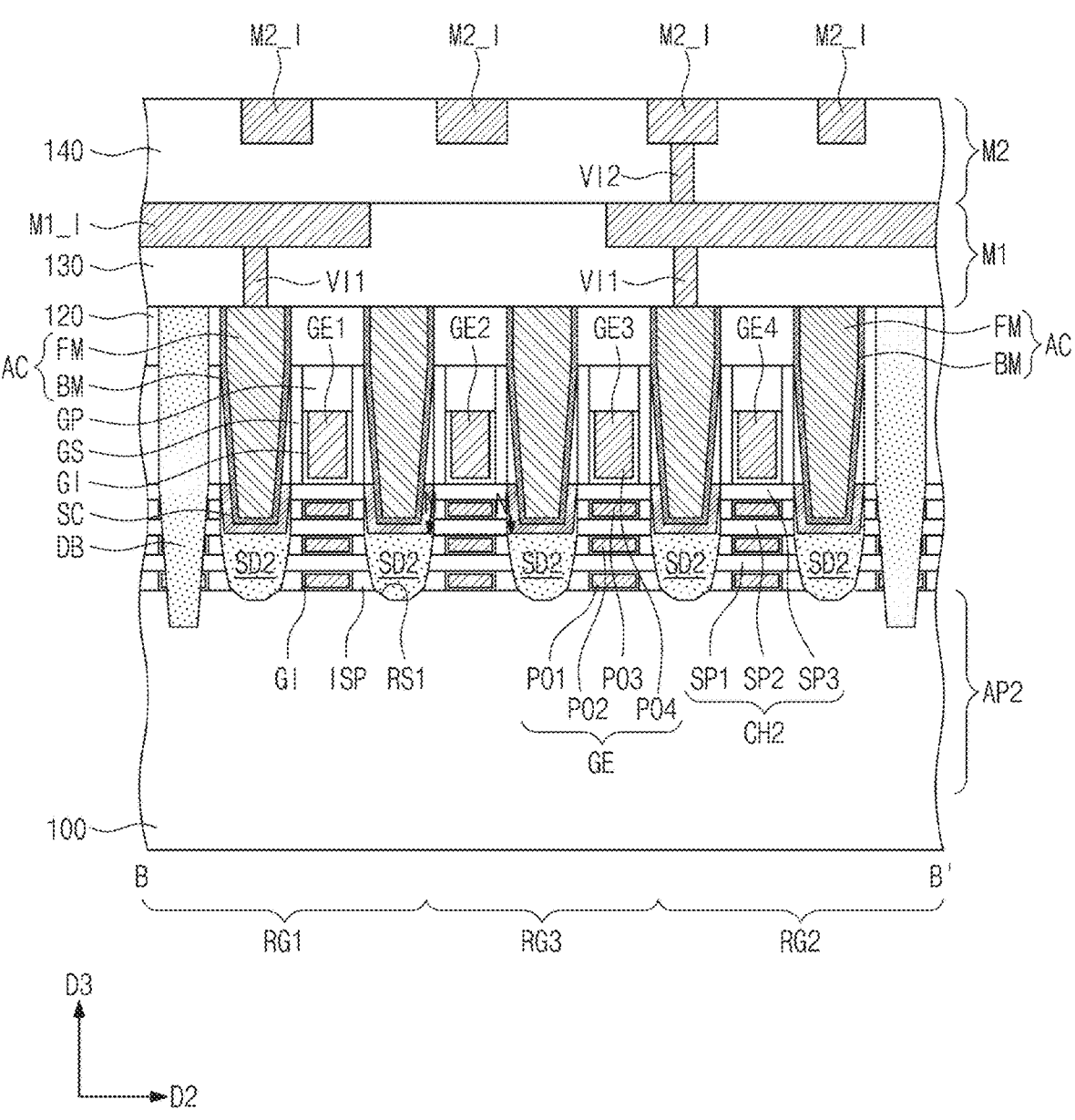
Figure 5C:
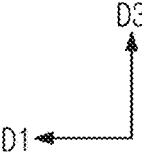
Figure 5D:
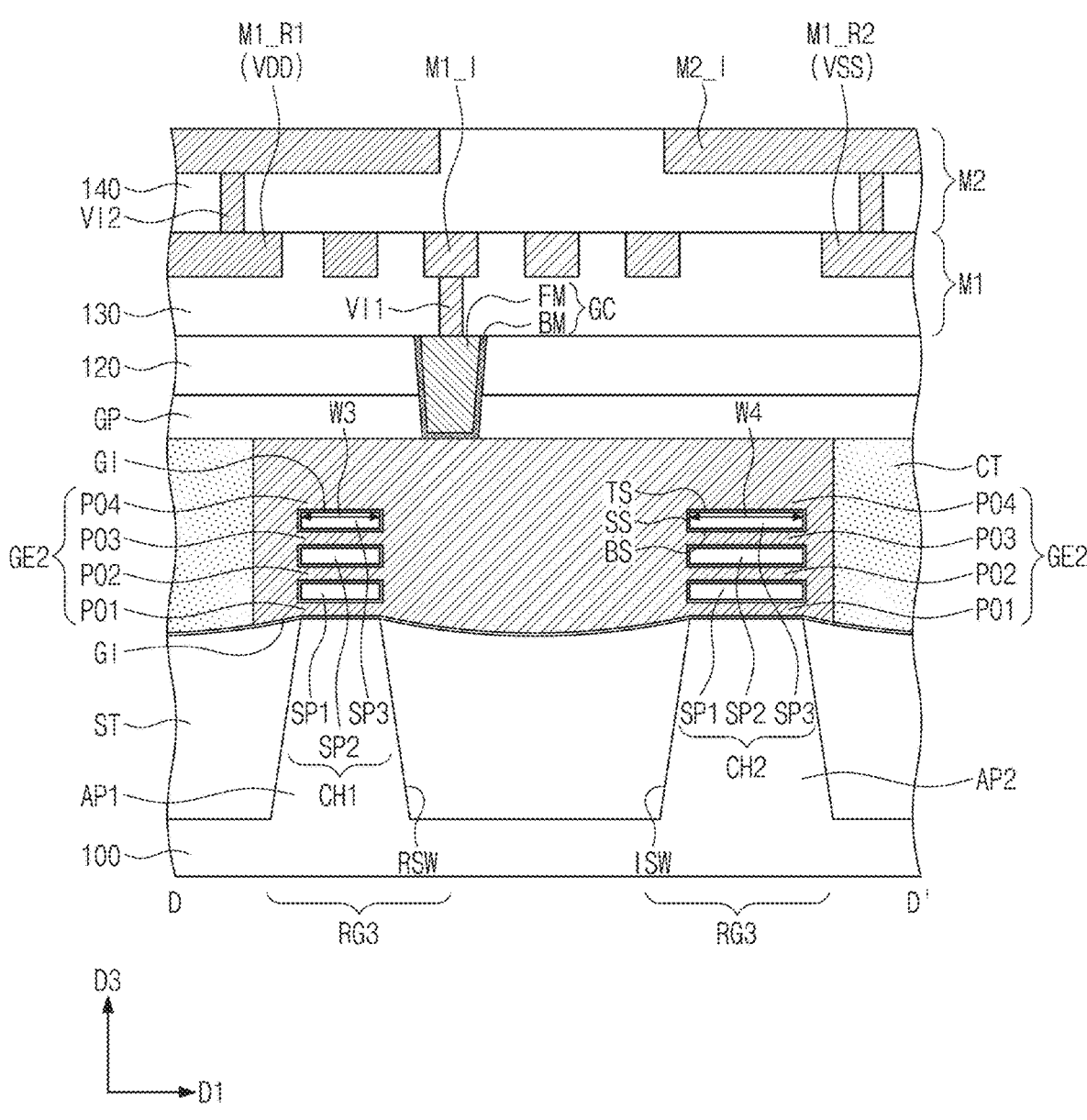
Figure 5E:
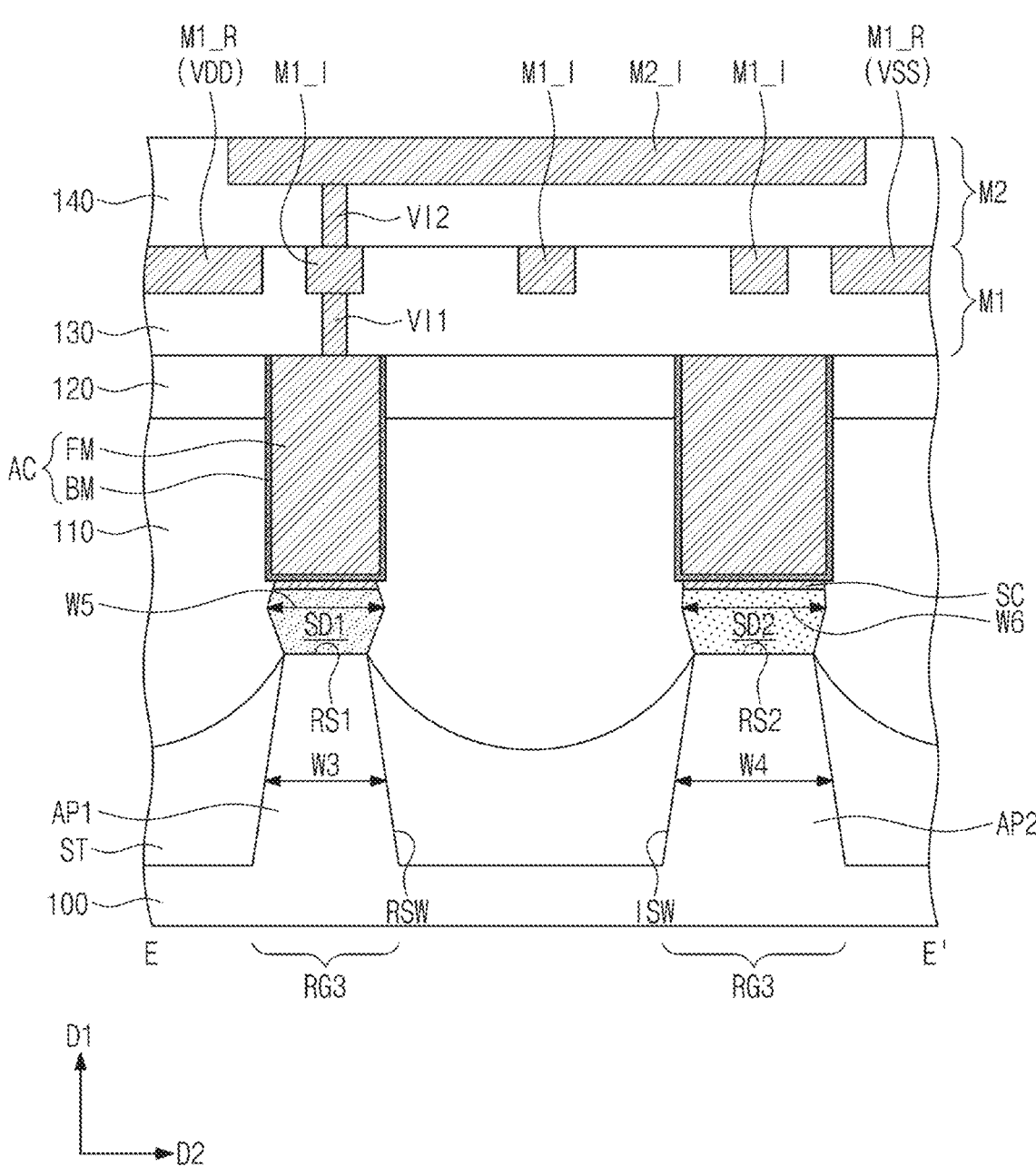
Figure 6A:
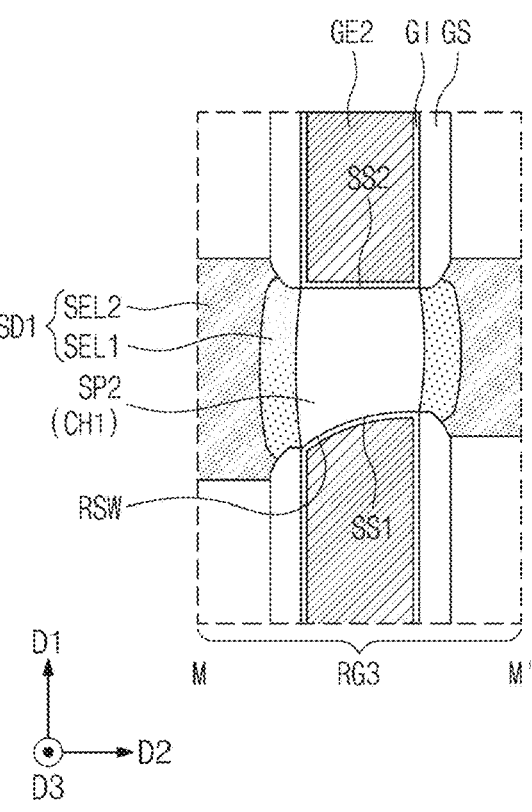
FIG. 6A illustrates a top view taken along line M-M' of FIG. 5A.
Figure 6B:
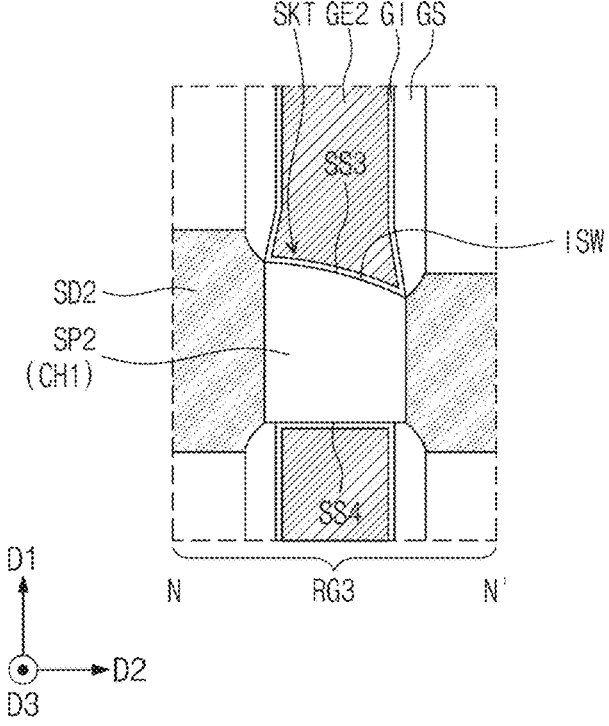
FIG. 6B illustrates a top view taken along line N-N' of FIG. 5B.

FIG. 4 illustrates a plan view showing a semiconductor device according to some example embodiments. FIGS. 5A, 5B, 5C, 5D, and 5E illustrate cross-sectional views respectively taken along lines A-A', B-B', C-C', D-D', and E-E' of FIG. 4. FIG. 6A illustrates a top view taken along line M-M' of FIG. 5A. FIG. 6B illustrates a top view taken along line N-N' of FIG. 5B. A semiconductor device shown in FIGS. 4 and 5A to 5E is a detailed example of the single height cell SHC depicted in FIG. 1.

Referring to FIGS. 4 and 5A to 5E, a single height cell SHC may be provided on a substrate 100. The single height cell SHC may be provided thereon with logic transistors included in a logic circuit (such as a logic gate or other standard cell). The substrate 100 may be or may include or be included in a compound semiconductor substrate or a semiconductor substrate including silicon, germanium, or silicon-germanium. For example, the substrate 100 may be a silicon substrate.

The single height cell SHC may include a first active pattern AP1 and a second active pattern AP2. The first active pattern AP1 and the second active pattern AP2 may be defined by a trench TR formed on an upper portion of the substrate 100. For example, the trench TR may be positioned between the first active pattern AP1 and the second active pattern AP2. The first active pattern AP1 and the second active pattern AP2 may be spaced apart in a first direction D1 from each other across the trench TR.

The first and second active patterns AP1 and AP2 may be or may include upper portions of the substrate 100 that vertically protrude from the substrate 100. The first and second active patterns AP1 and AP2 may extend in parallel to each other in a second direction D2. The second direction D2 may be a horizontal direction. In some example embodiments, the first active pattern AP1 may correspond to or include or be included in the PMOSFET region PR of FIG. 1. The second active pattern AP2 may correspond to or include or be included in the NMOSFET region NR of FIG. 1.

The trench TR may be completely or at least partly filled with a device isolation layer ST such as a shallow trench isolation oxide. The device isolation layer ST may cover sidewalls of the first and second active patterns AP1 and AP2. For example, the device isolation layer ST may include a silicon oxide layer.

The first active pattern AP1 may be provided thereon with a plurality of first channel patterns CH1 and a plurality of first source/drain patterns SD1. The first channel patterns CH1 and the first source/drain patterns SD1 may be alternately arranged along the second direction D2. The second active pattern AP2 may be provided thereon with a plurality of second channel patterns CH2 and a plurality of second source/drain patterns SD2. The second channel patterns CH2 and the second source/drain patterns SD2 may be alternately arranged along the second direction D2.

Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction (or a third direction D3). Each of the first, second, and third semiconductor patterns SP1, SP2, and SP3 may include silicon (Si), germanium (Ge), or silicon-germanium (SiGe). For example, each of the first, second, and third semiconductor patterns SP1, SP2, and SP3 may include silicon (Si).

The first source/drain patterns SD1 may be or may include impurity regions having a first conductivity type (e.g., p-type). The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3. Each of the first source/drain patterns SD1 may be provided in a first recess RS1 between the pair of first channel patterns CH1.

The second source/drain patterns SD2 may be or may include impurity regions having a second conductivity type (e.g., n-type). The second channel pattern CH2 may be interposed between a pair of second source/drain patterns

6

SD2. For example, the pair of second source/drain patterns SD2 may be connected to each other through the stacked first, second, and third semiconductor patterns SP1, SP2, and SP3. Each of the second source/drain patterns SD2 may be provided in a second recess RS2 between the pair of second channel patterns CH2.

The first and second source/drain patterns SD1 and SD2 may be or may include epitaxial patterns, e.g., patterns that are formed by a selective epitaxial growth process.

The epitaxial patterns may be homogenous or may be heterogenous epitaxial patterns. There may be a seem or an interface between at least one of the first and second source/drain patterns SD1 and SD2 and the respective active pattern AP1 or AP2. The interface may be observable with, for example, a high-resolution transmission electron microscope (HR-TEM) image. However, example embodiments are not limited thereto.

In some example embodiments, for example, each of the first source/drain patterns SD1 may have a top surface higher than that of the third semiconductor pattern SP3. Each of the second source/drain patterns SD2 may have a top surface located at substantially the same as that of a top surface of the third semiconductor pattern SP3. Alternatively, each of the second source/drain patterns SD2 may have a top surface higher than that of the third semiconductor pattern SP3.

The first source/drain patterns SD1 may include a semiconductor element (e.g., SiGe) whose lattice constant is greater than that of a semiconductor element of the substrate 100. In some example embodiments, a pair of first source/drain patterns SD1 may provide the first channel pattern CH1 with compressive stress. The second source/drain patterns SD2 may include the same semiconductor element (e.g., Si) as that of the substrate 100, and/or may include silicon carbon (SiC) which may provide the second channel pattern CH2 with tensile strain; however, example embodiments are not limited thereto.

Gate electrodes GE may be provided to extend in the first direction D1, while running across the first and second active patterns AP1 and AP2. The gate electrodes GE may be arranged at a first pitch in the second direction D2. Each of the gate electrodes GE may vertically overlap the first and second channel patterns CH1 and CH2. The gate electrodes GE may include first to fourth gate electrodes GE1 to GE4 that are sequentially arranged in the second direction D2.

The gate electrode GE may include a first inner electrode PO1 interposed between the substrate 100 and the first semiconductor pattern SP1, a second inner electrode PO2 interposed between the first semiconductor pattern SP1 and the second semiconductor pattern SP2, a third inner electrode PO3 interposed between the second semiconductor pattern SP2 and the third semiconductor pattern SP3, and an outer electrode PO4 on the third semiconductor pattern SP3.

Referring back to FIG. 5A, on the first active pattern AP1, the gate electrode GE may have different widths at the first, second, and third inner electrodes PO1, PO2, and PO3. For example, a first width such as a maximum width in the second direction D2 of the first inner electrode PO1 may be greater than a second width such as a maximum width in the second direction D2 of the second inner electrode PO2. The maximum width in the second direction D2 of the first inner electrode PO1 may be greater than a maximum in the second direction D2 of the third inner electrode PO3. The maximum width in the second direction D2 of the second inner electrode PO2 may be greater or less than the maximum width in the second direction D2 of the third inner electrode PO3.

Referring back to FIG. 5C, the gate electrode GE may be provided on a top surface TS, a bottom surface BS, and opposite lateral surfaces SS of each of the first, second, and third semiconductor patterns SP1, SP2, and SP3. For example, a transistor according to various example embodiments may be a three-dimensional field effect transistor (e.g., MBCFET™ or GAAFET) in which the gate electrode GE three-dimensionally surrounds the first and second channel patterns CH1 and CH2.

Referring back to FIGS. 4 and 5A to 5E, a pair of gate spacers GS may be correspondingly disposed on opposite sidewalls of the outer electrode PO4 of the gate electrode GE. The gate spacers GS may extend in the first direction D1 along the gate electrode GE. The gate spacers GS may have top surfaces thereof at a level higher than that of the gate electrode GE. The top surfaces of the gate spacers GS may be coplanar with that of a first interlayer dielectric layer 110 which will be discussed below. The gate spacers GS may include at least one selected from SiCN, SiCON, and SiN. Alternatively or additionally, the gate spacers GS may each include a multiple layer formed of at least two selected from SiCN, SiCON, and SiN.

A gate capping pattern GP may be provided on the gate electrode GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one selected from SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may cover the top surface TS, the bottom surface BE, and the opposite lateral surfaces SS of each of the first, second, and third semiconductor patterns SP1, SP2, and SP3. The gate dielectric layer GI may cover a top surface of the device isolation layer ST that underlies the gate electrode GE (see, e.g., FIG. 5C).

Although not shown, the gate electrode GE may include a first metal pattern and a second metal pattern on the first metal pattern. The first metal pattern may be provided on the gate dielectric layer GI and may be adjacent to the first, second, and third semiconductor patterns SP1, SP2, and SP3. The first metal pattern may include a work-function metal that controls a threshold voltage of a transistor. A thickness and/or composition of the first metal pattern may be adjusted to achieve a desired threshold voltage of a transistor. For example, the first, second, and third inner electrodes PO1, PO2, and PO3 of the gate electrode GE may be formed of the first metal pattern or the work-function metal.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In some example embodiments, the first metal pattern may further include carbon I. The first metal pattern may include a plurality of stacked work-function metal layers. The second metal pattern may include metal whose resistance is less than that of the first metal pattern. For example, the second metal pattern may include at least one metal selected from tungsten (W), aluminum (Al), titanium (Ti), and tantalum (Ta). For example, the outer electrode PO4 of the gate electrode GE may include a first metal pattern and a second metal pattern on the first metal pattern.

In some example embodiments, the gate dielectric layer GI may include one or more of a silicon oxide layer, a silicon oxynitride layer, and a high-k dielectric layer. For example, the gate dielectric layer GI may have a structure in which a silicon oxide layer and a high-k dielectric layer are stacked. The high-k dielectric layer may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Alternatively or additionally, a semiconductor device according to various example embodiments may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, for example, at least one selected from hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped therein. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, at least one selected from hafnium oxide, zirconium oxide, and aluminum oxide, but the present inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but the present inventive concepts are not limited thereto. Because ferroelectric materials have their own critical thickness that exhibits ferroelectric properties, the thickness of the ferroelectric material layer may depend on ferroelectric material.

For example, the gate dielectric layer GI may include one ferroelectric material layer. For another example, the gate dielectric layer GI may include a plurality of ferroelectric material layers that are spaced apart from each other. The gate dielectric layer GI may have a stack structure in which a plurality of ferroelectric material layers are alternately stacked with a plurality of paraelectric material layers.

Referring back to FIG. 5B, inner spacers ISP may be provided on the second active pattern AP2. The inner spacers IP may be correspondingly interposed between the second source/drain pattern SD2 and the first, second, and third inner electrodes PO1, PO2, and PO3 of the gate electrode GE. The inner spacers IP may be in direct contact with the second source/drain pattern SD2. The inner spacer IP may separate the second source/drain pattern SD2 from each of the first, second, and third inner electrodes PO1, PO2, and PO3 of the gate electrode GE.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. The first interlayer dielectric layer 110 may be provided thereon with a second interlayer dielectric layer 120 that covers the gate capping pattern GP. For example, the first and second interlayer dielectric layers 110 and 120 may include a silicon oxide layer.

The single height cell SHC may include a first cell boundary CB1 that extends in the second direction D2. The single height cell SHC may further include a second cell boundary CB2 that stands opposite to the first cell boundary CB1. Gate cutting patterns CT may be disposed on the first and second cell boundaries CB1 and CB2. When viewed in plan, the gate cutting patterns CT may be disposed to correspondingly overlap the gate electrodes GE.

The gate cutting pattern CT may penetrate the gate electrode GE. The gate cutting pattern CT may extend in the third direction D3 from the device isolation layer ST to the gate capping pattern GP. The gate cutting pattern CT may include a dielectric material, such as a silicon nitride layer, a silicon oxide layer, or a combination thereof. The gate cutting pattern CT may separate the gate electrode GE of the single height cell SHC from a gate electrode of an adjacent another logic cell.

The logic cell LC may have, on opposite sides thereof, a pair of diffusion breaks/separation structures DB that are opposite to each other in the second direction D2. The separation structure DB may extend in the first direction D1 parallel to the gate electrodes GE. A pitch between the separation structure DB and its adjacent gate electrode GE may be the same as the first pitch.

The separation structure DB may penetrate the first and second interlayer dielectric layers 110 and 120 to extend into the first and second active patterns AP1 and AP2. The separation structure DB may penetrate an upper portion of each of the first and second active patterns AP1 and AP2. The separation structure DB may separate the first and second active patterns AP1 and AP2 of the logic cell LC from an active region of an adjacent logic cell.

Active contacts AC may be provided to penetrate the first and second interlayer dielectric layers 110 and 120 to come into electrical connection with the first and second source/drain patterns SD1 and SD2. A pair of active contacts AC may be correspondingly provided on opposite sides of the gate electrode GE. When viewed in plan, the active contact AC may have a bar shape that extends in the first direction D1.

The active contact AC may be or may correspond to a self-aligned contact; however, example embodiments are not limited thereto. For example, the gate capping pattern GP and the gate spacer GS may be used to form the active contact AC in a self-alignment manner. The active contact AC may cover, for example, at least a portion of a sidewall of the gate spacer GS. Although not shown, the active contact AC may cover a portion of the top surface of the gate capping pattern GP.

Metal-semiconductor compound layers SC may be correspondingly interposed between the active contact AC and the first source/drain pattern SD1 and between the active contact AC and the second source/drain pattern SD2. The active contact AC may be electrically connected through the metal-semiconductor compound layer SC to one of the first and second source/drain patterns SD1 and SD2. The metal-semiconductor compound layer SC may include metal silicide, for example, at least one selected from titanium silicide, tantalum silicide, tungsten silicide, nickel silicide, and cobalt silicide.

A gate contact GC may be provided to penetrate the second interlayer dielectric layer 120 and the gate capping pattern GP to come into electrical connection with the gate electrode GE. Each of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CON) layer, and a platinum nitride (PtN) layer.

A first metal layer M1 may be provided in a third interlayer dielectric layer 130. The first metal layer M1 may include a first power line M1_R1, a second power line M1_R2, and lower lines M1_I.

Each of the first power line M1_R1 and the second power line M1_R2 may extend in the second direction, while running across the single height cell SHC. The first power line M1_R1 may be disposed on the first cell boundary CB1 of the logic cell LC. The first power line M1_R1 may extend in the second direction D2 along the first cell boundary CB1. The second power line M1_R2 may be disposed on the second cell boundary CB2 of the logic cell LC. The second power line M1_R2 may extend in the second direction D2 along the second cell boundary CB2.

The lower lines M1_I may be disposed between the first and second power lines M1_R1 and M1_R2. Each of the lower lines M1_I may have a linear or bar shape that extends in the second direction D2. The lower lines M1_I may be arranged at a second pitch along the first direction D1. For example, the second pitch may be less than the first pitch.

The first metal layer M1 may further include lower vias VI1. The lower vias VI1 may be provided below the lines M1_R1, M1_R2, and M1_I of the first metal layer M1. The lower vias VI1 may be correspondingly interposed between the active contacts AC and the lines M1_R1, M1_R2, and M1_I of the first metal layer M1. The lower vias VI1 may be correspondingly interposed between the gate contacts GC and the lines M1_R1, M1_R2, and M1_I of the first metal layer M1.

The lines M1_R1, M1_R2, and M1_I and its underling lower vias VI1 of the first metal layer M1 may be formed by individual processes. For example, the lines M1_R1, M1_R2, and M1_I and the corresponding underlying lower vias VI1 of the first metal layer M1 may each be formed by a single damascene process; however, example embodiments are not limited thereto. A sub-20 nm process may be employed to fabricate a semiconductor device according to various example embodiments.

A second metal layer M2 may be provided in a fourth interlayer dielectric layer 140. The second metal layer M2 may include upper lines M2_I. Each of the upper lines M2_I of the second metal layer M2 may have a linear or bar shape that extends in the first direction D1. For example, the upper lines M2_I may extend in parallel to each other in the first direction D1. When viewed in plan, the upper lines M2_I may be parallel to the gate electrodes GE. The upper lines M2_I may be arranged at a third pitch along the second direction D2. The third pitch may be less than the first pitch. The third pitch may be greater than the second pitch.

The second metal layer M2 may further include upper vias VI2. The upper vias VI2 may be provided below the upper lines M2_I. The upper vias VI2 may be correspondingly interposed between the upper lines M2_I and the lines M1_R1, M1_R2, and M1_I of the first metal layer M1.

The upper line M2_I and the corresponding underlying upper via VI2 of the second metal layer M2 may be formed into a single piece in the same process. For example, a dual damascene process may be employed to simultaneously form the upper line M2_I and the upper via VI2 of the second metal layer M2; however, example embodiments are not limited thereto.

The first and second metal layers M1 and M2 may have their wiring lines that include the same or at least one different conductive materials. For example, the first and second metal layers M1 and M2 may have their wiring lines that independently include at least one metallic material selected from aluminum, copper, tungsten, molybdenum, and cobalt. Although not shown, additional metal layers (e.g., M3, M4, M5, etc.) may further be stacked on the fourth interlayer dielectric layer 140. Each of the stacked metal layers may include routing lines.

Referring back to FIG. 4, the second active pattern AP2 may have a width in the first direction D1. The second active pattern AP2 may include a first region RG1 having a first width W1, a second region RG2 having a second width W2, and a third region RG3 having a fourth width W4. A first gate electrode GE1 may be disposed on the first region RG1. A fourth gate electrode GE4 may be disposed on the second region RG2. Second and third gate electrodes GE2 and GE3 may be disposed on the third region RG3.

The first width W1 may be greater than the second width W2. For example, the first region RG1 may be or may correspond to an active region having a relatively large width, and the second region RG2 may be or may include or be included in an active region having a relatively small width. The third region RG3 may be interposed between the first region RG1 and the second region RG2. The third region RG3 may be an intermediate region where the first width W1 of the first region RG1 is changed into the second width W2 of the second region RG2. Thus, the fourth width W4 of the third region RG3 may gradually decrease or taper in a curved fashion, or in a piecewise linear fashion, in a direction from the first region RG1 toward the second region RG2. The fourth width W4 may be greater than the second width W2 and less than the first width W1.

When viewed in plan, the third region RG3 may have a tapered shape. The third region RG3 may have an inclined sidewall ISW. The first region RG1 may have a first sidewall SW1 that extends in the second direction D2, and the second region RG2 may have a second sidewall SW2 that extends in the second direction D2. The inclined sidewall ISW may connect the first sidewall SW1 of the first region RG1 to the second sidewall SW2 of the second region RG2.

The width W4 of the third region RG3 on the second active pattern AP2 may gradually decrease (e.g., linearly or curvedly) along the second direction D2. For example, a width W4a of the third region RG3 adjacent to the second gate electrode GE2 may be greater than a width W4b of the third region RG3 adjacent to the third gate electrode GE3.

The second source/drain pattern SD2 on the first region RG1 may have a size greater than that of the second source/drain pattern SD2 on the second region RG2. For example, a width in the first direction D1 of the second source/drain pattern SD2 on the first region RG1 may be greater than a width in the first direction D1 of the second source/drain pattern SD2 on the second region RG2. This may be caused by the fact that the first width W1 of the first region RG1 is greater than the second width W2 of the second region RG2. A size (or maximum width) of a source/drain pattern may be proportional to a width of an active region.

A size of the second source/drain pattern SD2 on the third region RG3 may be greater than the size of the second source/drain pattern SD2 on the second region RG2. The size of the second source/drain pattern SD2 on the third region RG3 may be less than the size of the second source/drain pattern SD2 on the first region RG1. For example, a width of the second source/drain pattern SD2 between the second and third gate electrodes GE2 and GE3 may be greater than a width of the second source/drain pattern SD2 between the first and second gate electrodes GE1 and GE2 and less than a width of the second source/drain pattern SD2 between the third and fourth gate electrodes GE3 and GE4.

As in the second active pattern AP2, the first active pattern AP1 may also include first, second, and third regions RG1, RG2, and RG3. The third region RG3 of the first active pattern AP1 may have a third width W3. The third width W3 of the third region RG3 on the first active pattern AP1 may be less than the fourth width W4 of the third region RG3 on the second active pattern AP2 (see FIG. 5E).

The third region RG3 of the first active pattern AP1 may have a recessed sidewall RSW. The recessed sidewall RSW may have a shape that is recessed toward the first cell boundary CB1 when viewed in plan. The recessed sidewall RSW may connect the first sidewall SW1 of the first region RG1 to the second sidewall SW2 of the second region RG2 when viewed in plan. The recessed sidewall RSW may cause that the width W3 of the third region RG3 on the first active pattern AP1 decreases and then increases again along the second direction D2.

A width W3$a$ of the third region RG3 adjacent to one side of the second gate electrode GE2 may be greater than a width W3$b$ of the third region RG3 adjacent to another side of the second gate electrode GE2. A width W3$c$ of the third region RG3 adjacent to the third gate electrode GE3 may be greater than the width W3$b$ of the third region RG3 adjacent to the another side of the second gate electrode GE2.

A size of the first source/drain pattern SD1 on the first region RG1 may be greater than a size of the first source/drain pattern SD1 on the second region RG2. A size of the first source/drain pattern SD1 on the third region RG3 may be the same as or less than the size of the first source/drain pattern SD1 on the second region RG2. This may be caused by the fact that the recessed sidewall RSW gives a relatively small width W3$b$ to the third region RG3 between the second and third gate electrodes GE2 and GE3.

Referring back to FIG. 5E, a fifth width W5 may be given to the first source/drain pattern SD1 on the third region RG3. A sixth width W6 may be given to the second source/drain pattern SD2 on the third region RG3. The sixth width W6 may be greater than the fifth width W5. As discussed above, the fourth width W4 of the third region RG3 on the second active pattern AP2 may be greater than the third width W3 of the third region RG3 on the first active pattern AP1.

FIG. 6A may be a plan view obtained by when a semiconductor device is planarized to a level (or line M-M') of the second semiconductor pattern SP2 included in the first channel pattern CH1. FIG. 6B may be a plan view obtained by when a semiconductor device is planarized to a level (or line N-N') of the second semiconductor pattern SP2 included in the second channel pattern CH2.

Referring to FIG. 6A, the second semiconductor pattern SP2 of the first channel pattern CH1 may include a first lateral surface SS1 and a second lateral surface SS2. The first lateral surface SS1 and the second lateral surface SS2 may be opposite to each other in the first direction D1. The first and second lateral surfaces SS1 and SS2 may be covered with the gate dielectric layer GI. The second gate electrode GE2 may be close across the gate dielectric layer GI to the first and second lateral surfaces SS1 and SS2.

A pair of first source/drain patterns SD1 may be correspondingly provided on opposite sides of the second semiconductor pattern SP2. The first source/drain pattern SD1 may include a first semiconductor layer SEL1 connected to the second semiconductor pattern SP2, and may also include a second semiconductor layer SEL2 spaced apart from the second semiconductor pattern SP2 across the first semiconductor layer SEL1. A size of the first source/drain pattern SD1 on one side of the second semiconductor pattern SP2 may be greater than a size of the first source/drain pattern SD1 on another side of the second semiconductor pattern SP2.

The first semiconductor layer SEL1 may contain germanium (Ge) whose concentration (atomic concentration) is relatively low. Alternatively in some example embodiments, the first semiconductor layer SEL1 may include only silicon (Si) and may not include germanium (Ge) or may include germanium at a trace amount. The first semiconductor layer SEL1 may have a germanium concentration of about 0 at % to about 10 at %.

The second semiconductor layer SEL2 may contain germanium (Ge) whose concentration is relatively high. For example, the second semiconductor layer SEL2 may have a germanium concentration of about 30 at % to about 70 at %. The first and second semiconductor layers SEL1 and SEL2 may include impurities (e.g., boron) that cause the first source/drain pattern SD1 to have a p-type conductivity. The second semiconductor layer SEL2 may have an impurity concentration greater than that of the first semiconductor layer SEL1. In some example embodiments, each of the first and second semiconductor layers SEL1 and SEL2 may further include another impurity, such as at least one selected from P, As, and C, at the same or at different concentrations.

Figure 16A:
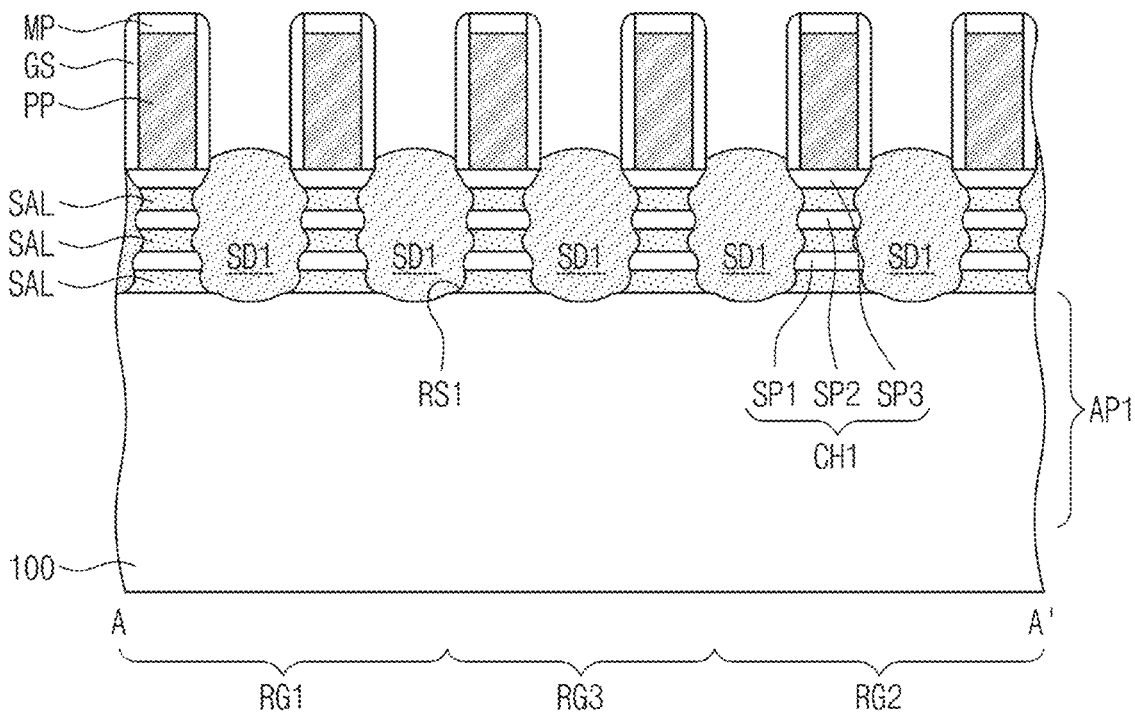
Figure 16B:
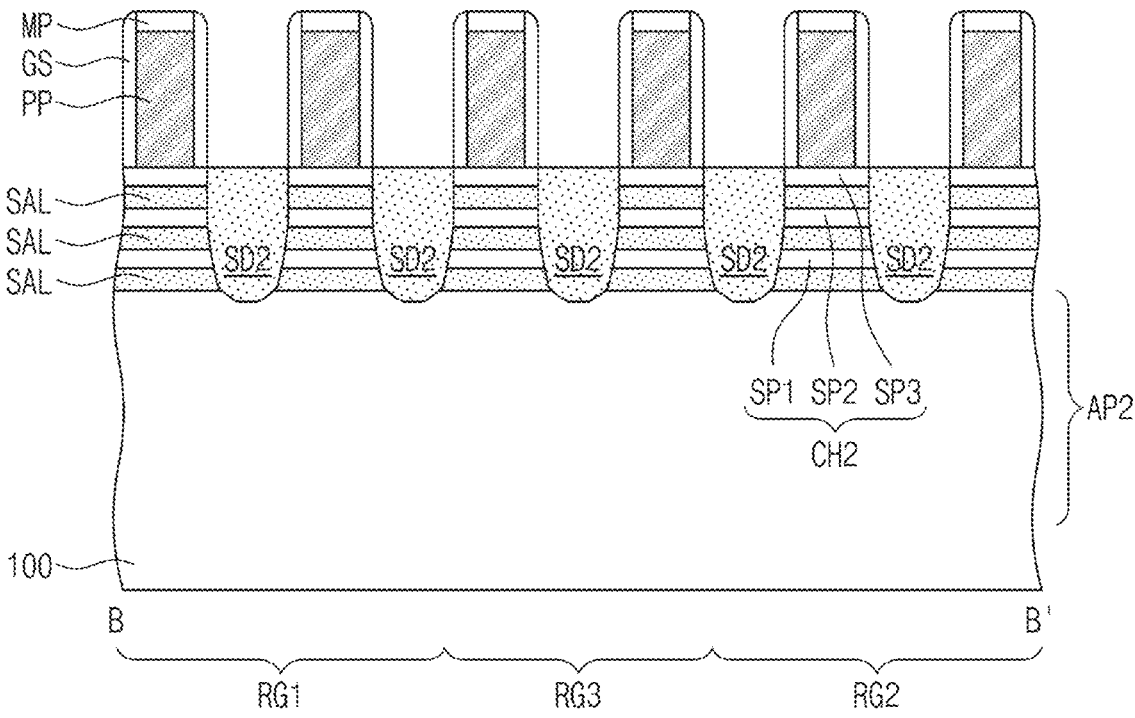

The first semiconductor layer SEL1 may protect the second semiconductor layer SEL2 while subsequently described sacrificial layers (see SAL of FIG. 16B) are replaced with the first, second, and third inner electrodes PO1, PO2, and PO3 of the gate electrode GE. For example, the first semiconductor layer SEL1 may prevent the second semiconductor layer SEL2 from being etched with an etching material that etches the sacrificial layers SAL.

The gate spacer GS may be provided on a sidewall of the second gate electrode GE2. The second gate electrode GE2 may be spaced apart from the first source/drain pattern SD1 across the gate spacer GS.

The second lateral surface SS2 may be parallel to the second direction D2. The first lateral surface SS1 may be defined by the recessed sidewall RSW discussed above. For example, the first lateral surface SS1 may have a concavely recessed profile.

Referring to FIG. 6B, the second semiconductor pattern SP2 of the second channel pattern CH2 may include a third lateral surface SS3 and a fourth lateral surface SS4. The third lateral surface SS3 and the fourth lateral surface SS4 may be opposite to each other in the first direction D1. The third and fourth lateral surfaces SS3 and SS4 may be covered with the gate dielectric layer GI. The second gate electrode GE2 may be close across the gate dielectric layer GI to the third and fourth lateral surfaces SS3 and SS4.

A pair of second source/drain patterns SD2 may be correspondingly provided on opposite sides of the second semiconductor pattern SP2. The second source/drain pattern SD2 may be directly connected to the second semiconductor pattern SP2. A size of the second source/drain pattern SD2 on one side of the second semiconductor pattern SP2 may be greater than a size of the second source/drain pattern SD2 on another side of the second semiconductor pattern SP2.

The fourth lateral surface SS4 may be parallel to the second direction D2. The third lateral surface SS3 may be defined by the inclined sidewall ISW discussed above. For example, the third lateral surface SS3 may have an inclined profile.

As shown in FIG. 6B, the second gate electrode GE2 may include a skirt portion SKT whose line-width abruptly increases in a plan view. The skirt portion SKT may be adjacent to the inclined sidewall ISW of the second channel pattern CH2. The inclined sidewall ISW of the second channel pattern CH2 may cause an inadequate etching of a sacrificial pattern PP which will be discussed below, with the result that the skirt portion SKT may be formed. In this sense, the skirt portion SKT may be formed when the gate electrode GE is formed on a convexly inclined sidewall such as the inclined sidewall ISW.

In contrast, the skirt portion SKT may not be formed on the recessed sidewall RSW that is concavely depressed as depicted in FIG. 6A. In PMOSFET, the skirt portion SKT of the gate electrode GE may cause easy occurrence of process failure such as fracture of the first source/drain pattern SD1. This may be caused by the fact that, when the skirt portion SKT induces the first semiconductor layer SEL1 and the gate electrode GE to adjoin to each other, the first semiconductor layer SEL1 may be easily fractured during a replacement process of the gate electrode GE.

According to various example embodiments, on the third region RG3 where the skit SKT is easily formed, the first channel pattern CH1 may be provided thereon not with the inclined sidewall ISW but with the recessed sidewall RSW. Thus, the skirt portion SKT may be prevented from or reduced in likelihood of being formed on the first channel pattern CH1. As a result, various example embodiments may prevent or reduce the likelihood of process failure such as fracture of the first source/drain pattern SD1, which may thereby increase device reliability and/or device yield.

Figure 14A:
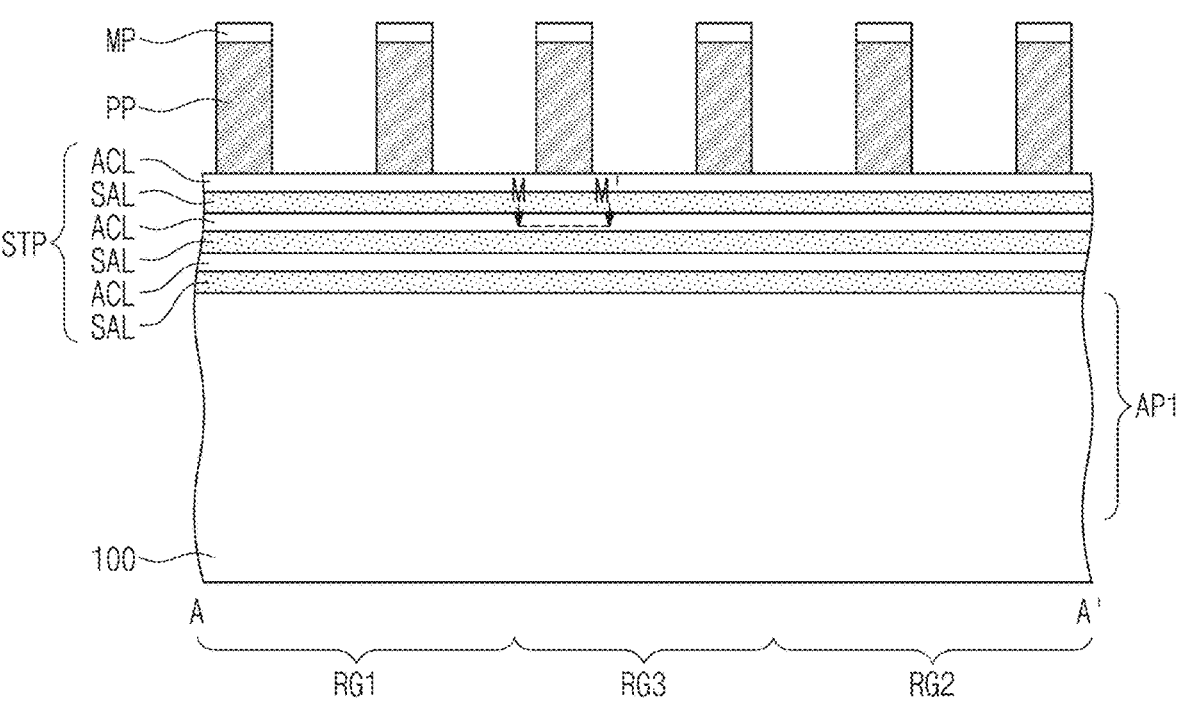
Figure 14B:
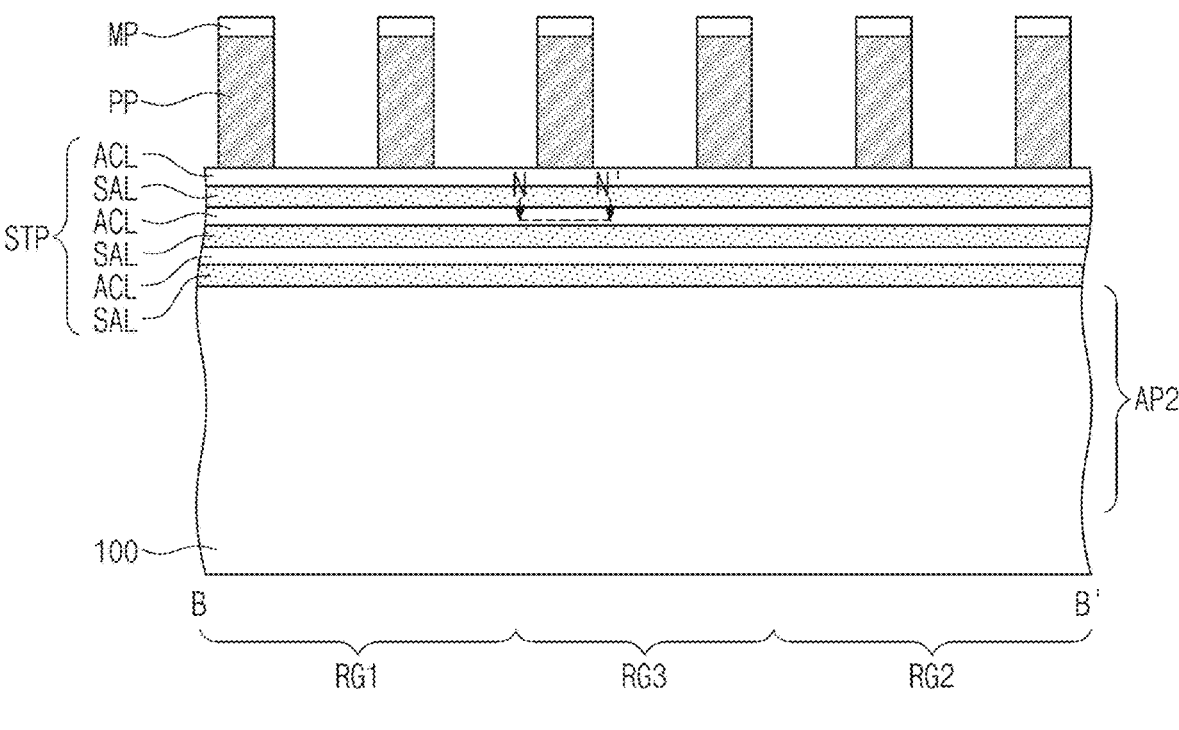
Figure 14C:
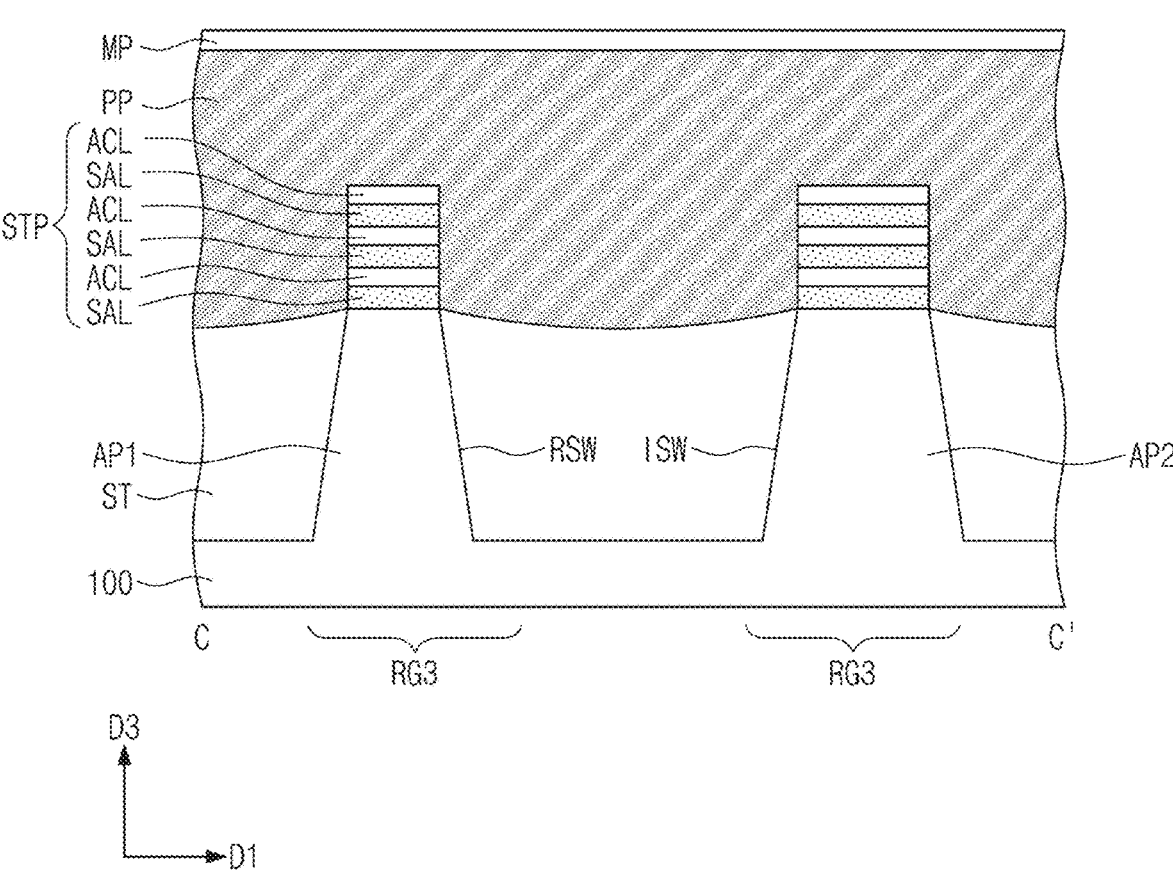
FIGS. 14C and 16C illustrate cross-sectional views taken along line C-C' of FIGS. 13 and 15, respectively.
Figure 16C:
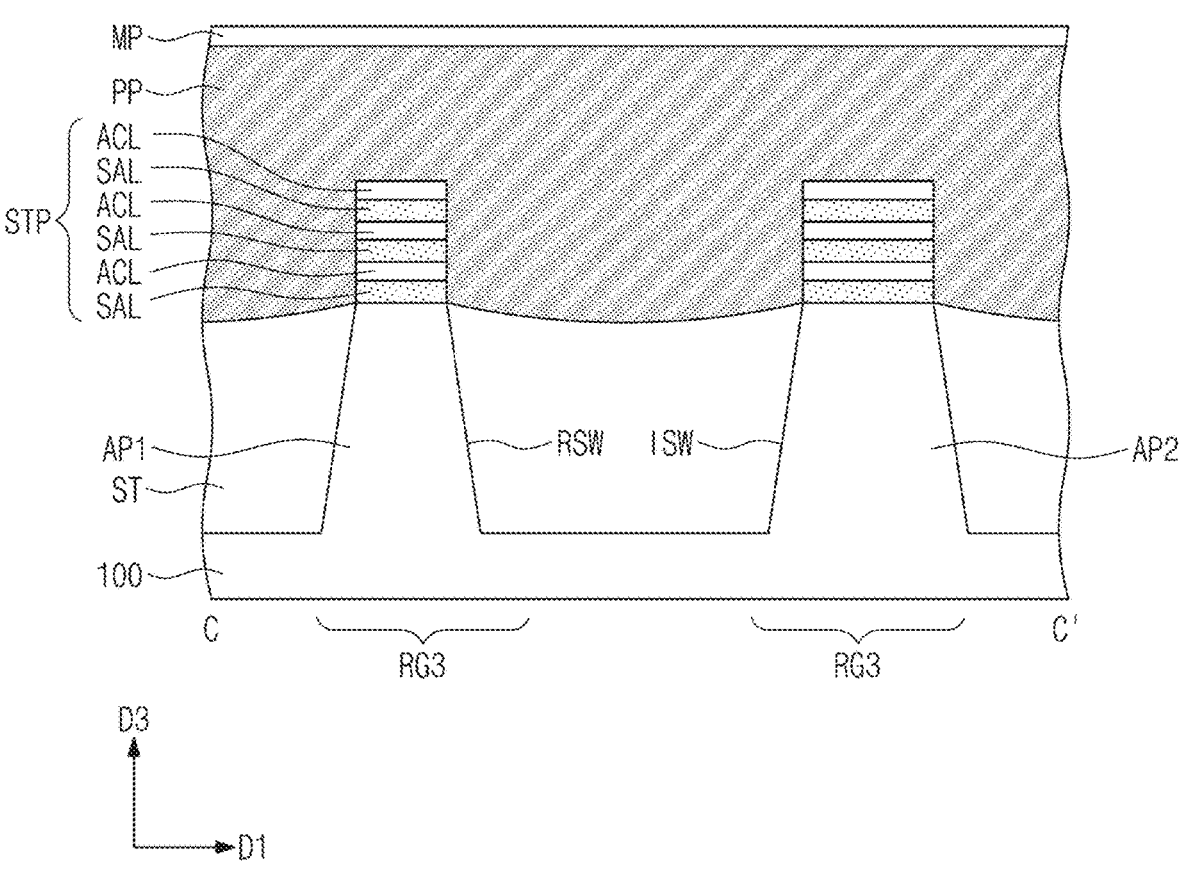
Figure 16D:
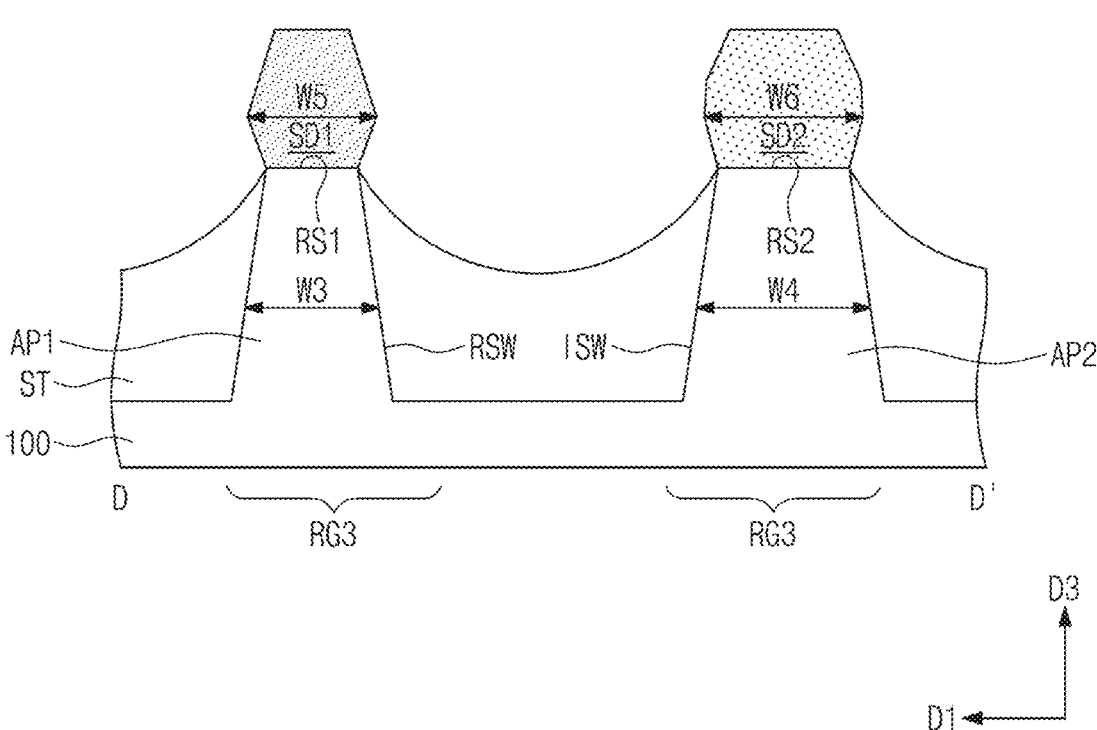
FIG. 16D illustrates a cross-sectional view taken along line D-D' of FIG. 15.
Figure 17A:
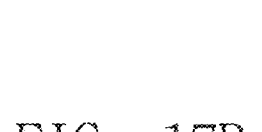
FIG. 17A illustrates a top view taken along line M-M' of FIG. 14A.
Figure 17B:
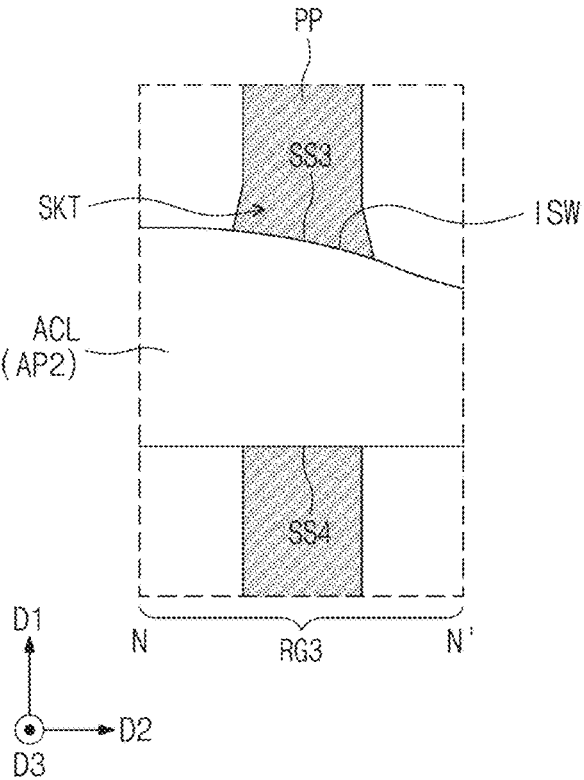
FIG. 17B illustrates a top view taken along line N-N' of FIG. 14B.

FIGS. 7, 9, 11, 13, and 15 illustrate plan views showing a method of fabricating a semiconductor device according to some example embodiments. FIGS. 8A, 10A, 12A, 14A, and 16A illustrate cross-sectional views taken along line A-A' of FIGS. 7, 9, 11, 13, and 15, respectively. FIGS. 8B, 10B, 12B, 14B, and 16B illustrate cross-sectional views taken along line B-B' of FIGS. 7, 9, 11, 13, and 15, respectively. FIGS. 14C and 16C illustrate cross-sectional views taken along line C-C' of FIGS. 13 and 15, respectively. FIG. 16D illustrates a cross-sectional view taken along line D-D' of FIG. 15. FIG. 17A illustrates a top view taken along line M-M' of FIG. 14A. FIG. 17B illustrates a top view taken along line N-N' of FIG. 14B.

Figure 7:
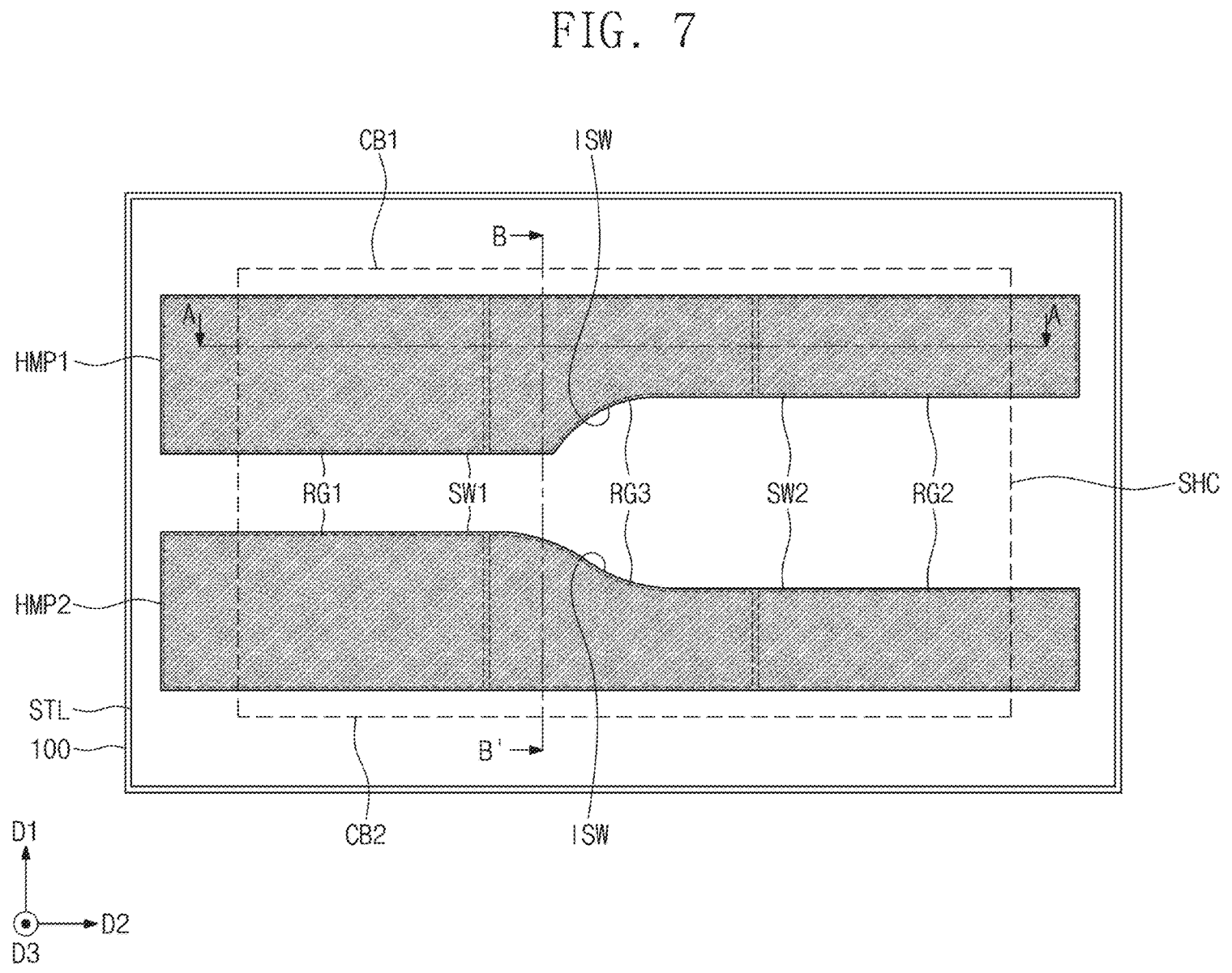
Figure 8A:
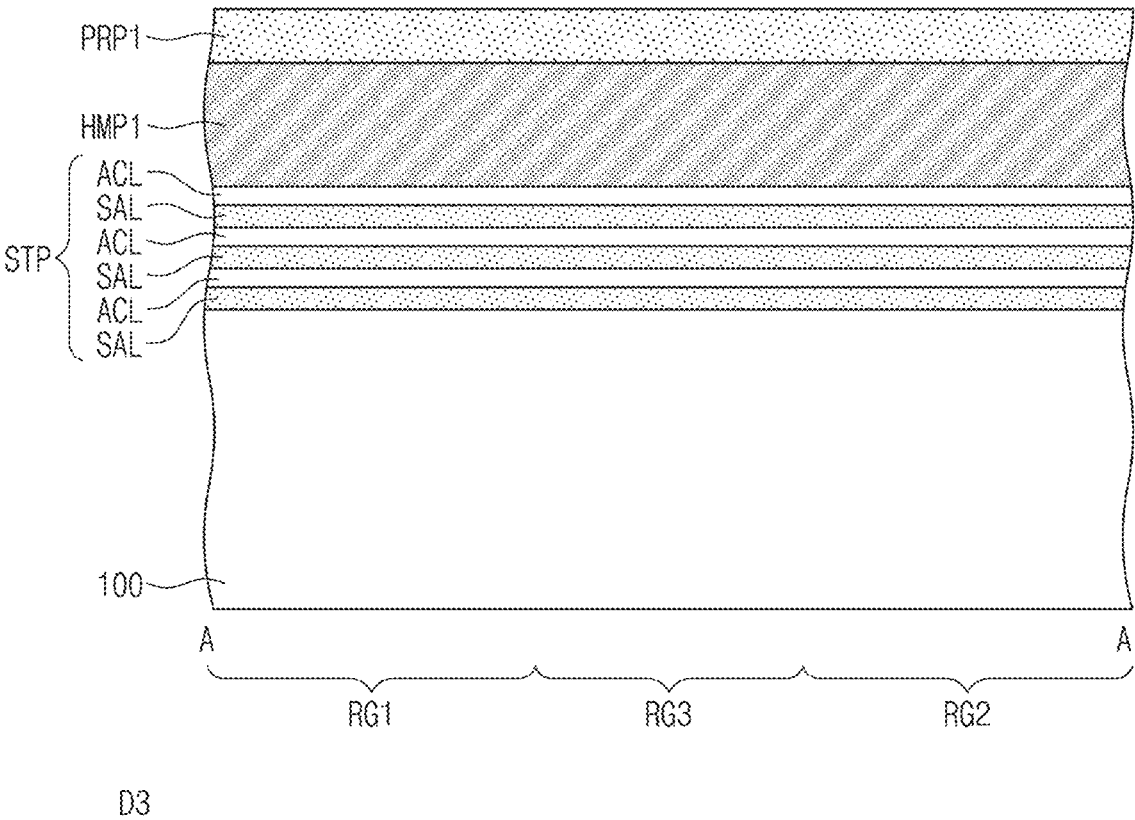
FIGS. 8A, 10A, 12A, 14A, and 16A illustrate cross-sectional views taken along line A-A' of FIGS. 7, 9, 11, 13, and 15, respectively.
Figure 8B:
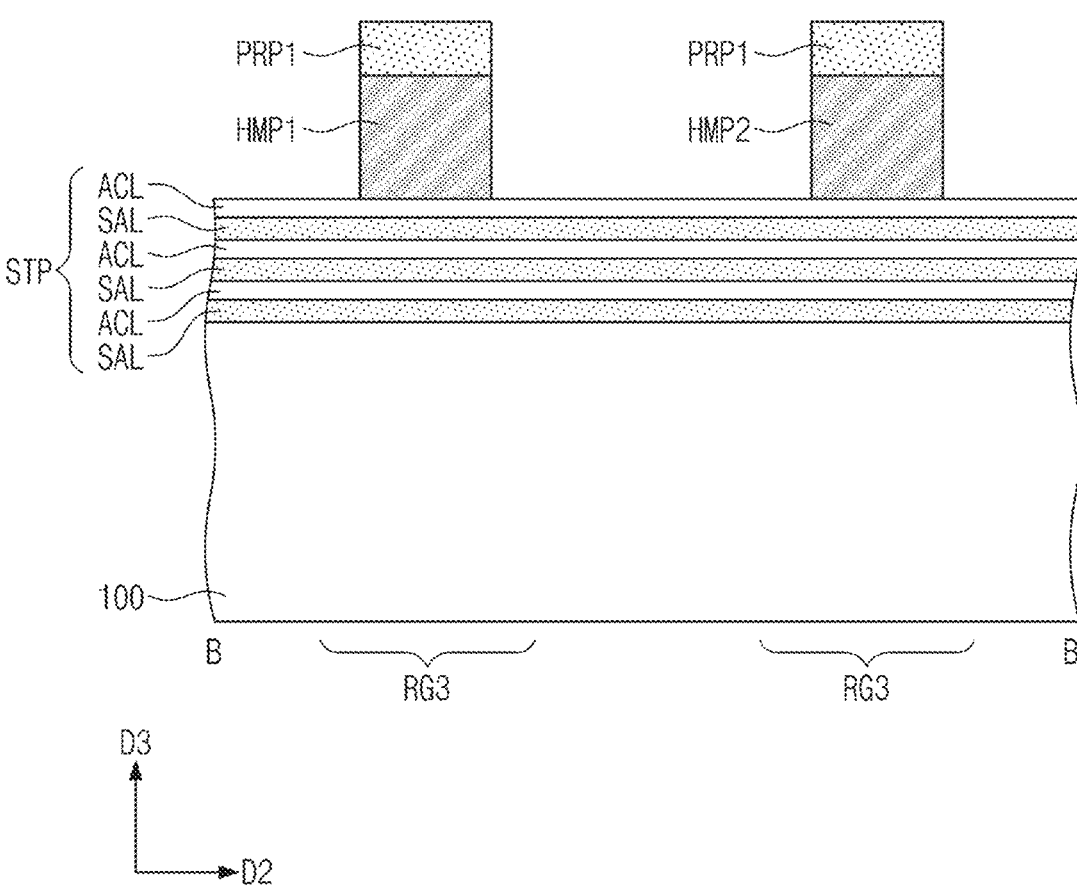
FIGS. 8B, 10B, 12B, 14B, and 16B illustrate cross-sectional views taken along line B-B' of FIGS. 7, 9, 11, 13, and 15, respectively.

Referring to FIGS. 7, 8A, and 8B, a substrate 100 may be provided, which includes a single height cell SHC. A stack layer STL may be formed on the substrate 100. The formation of the stack layer STL may include alternately forming sacrificial layers SAL and active layers ACL. The sacrificial layers SAL may include one of silicon (Si), germanium (Ge), and silicon-germanium (SiGe), and the active layers ACL may include another of silicon (Si), germanium (Ge), and silicon-germanium (SiGe).

For example, the sacrificial layers SAL may include silicon-germanium (SiGe) and may or may not include silicon, e.g., in a single-crystal or a polycrystalline phase, and the active layers ACL may include silicon (Si) and may or may not include SiGe, e.g., in a single-crystal or polycrystalline phase. Each of the sacrificial layers SAL may have a germanium concentration of about 10 at % to about 30 at %.

A first hardmask pattern HMP1 and a second hardmask pattern HMP2 may be formed on the substrate 100 to respectively define a first active pattern AP1 and a second active pattern AP2 which will be discussed below.

The first and second hardmask patterns HMP1 and HMP2 may be formed by a photolithography process. The first and second hardmask patterns HMP1 and HMP2 may be formed by being patterned by a first photoresist pattern PRP1.

Each of the first and second hardmask patterns HMP1 and HMP2 may include a silicon layer, a silicon oxide layer, a silicon nitride layer, a silicon oxynitride layer, a metal layer, or a combination thereof. In some example embodiments, each of the first and second hardmask patterns HMP1 and HMP2 may include first, second, and third mask layers that are sequentially stacked.

The first mask layer may include one or more of a silicon oxide layer, a silicon nitride layer, or a silicon oxynitride layer. The second mask layer may include one or more of a spin-on-hardmask (SOH) layer, a spin-on-carbon (SOC) layer, or an amorphous carbon layer. The third mask layer may include one or more of a silicon oxide layer, a silicon nitride layer, or a silicon oxynitride layer.

Each of the first and second hardmask patterns HMP1 and HMP2 may include a first region RG1, a second region RG2, and a third region RG3. The third region RG3 may connect the first region RG1 and the second region RG2 to each other. An inclined sidewall ISW of the third region RG3 may connect a first sidewall SW1 of the first region RG1 to a second sidewall SW2 of the second region RG2. The first and second hardmask patterns HMP1 and HMP2 may or may not be mirror-symmetric to each other. For example, as illustrated in FIG. 7 the first hardmask pattern HMP1 may have a sharp corner in transitioning from the first region RG1 to the third region RG3, while the second hardmask pattern HMP2 may have a curved transition from the first region RG1 to the third region RG3.

Figure 9:
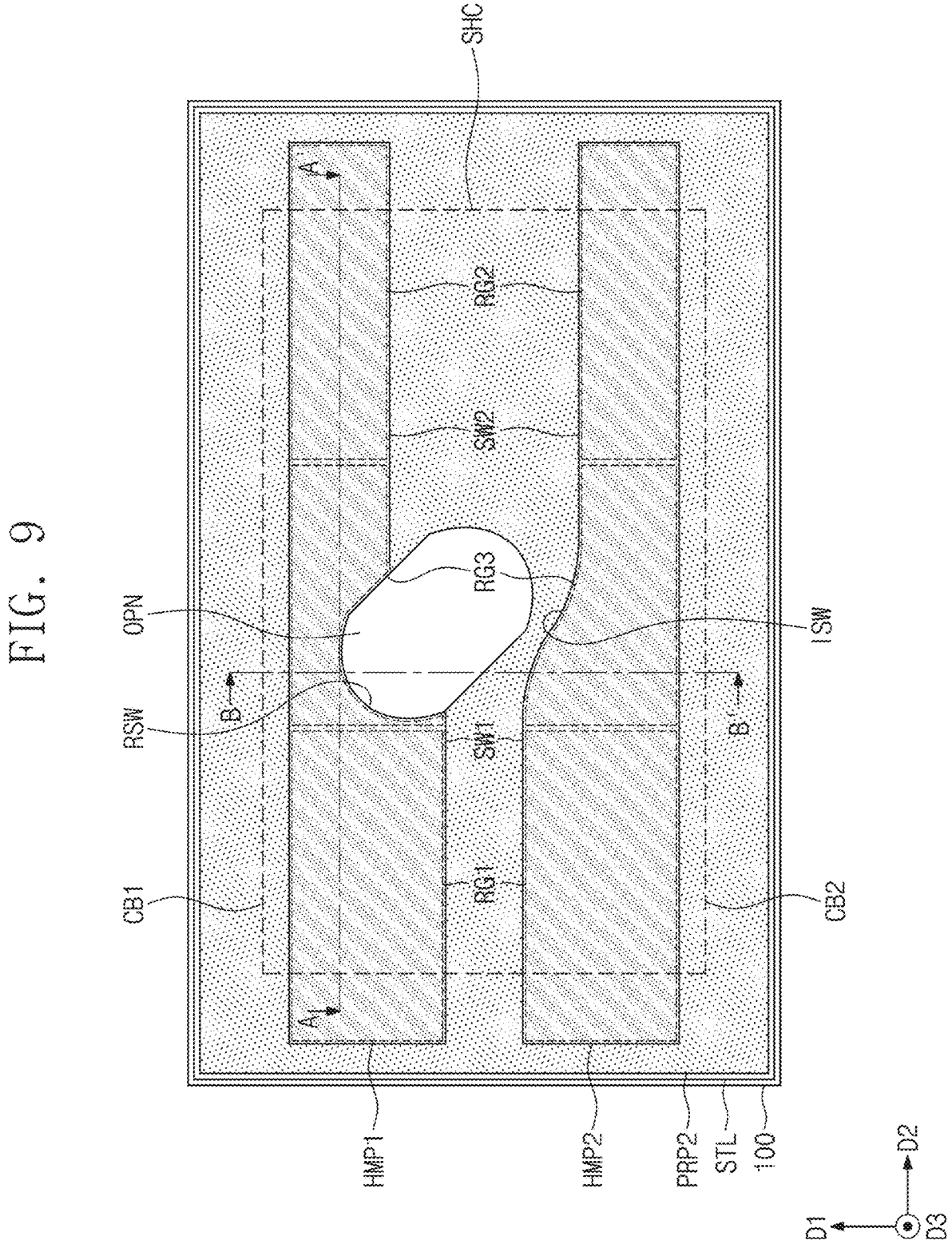
Figure 10A:
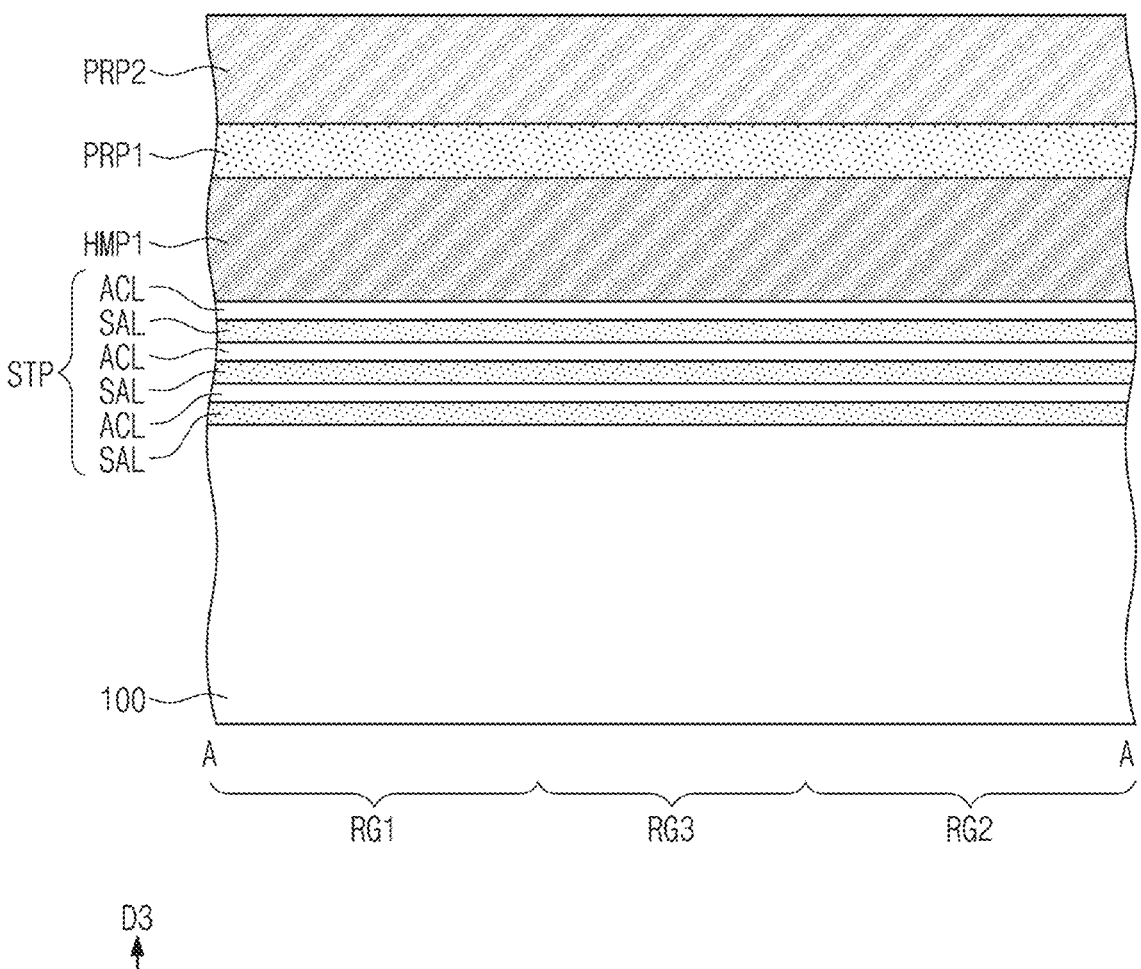
Figure 10B:
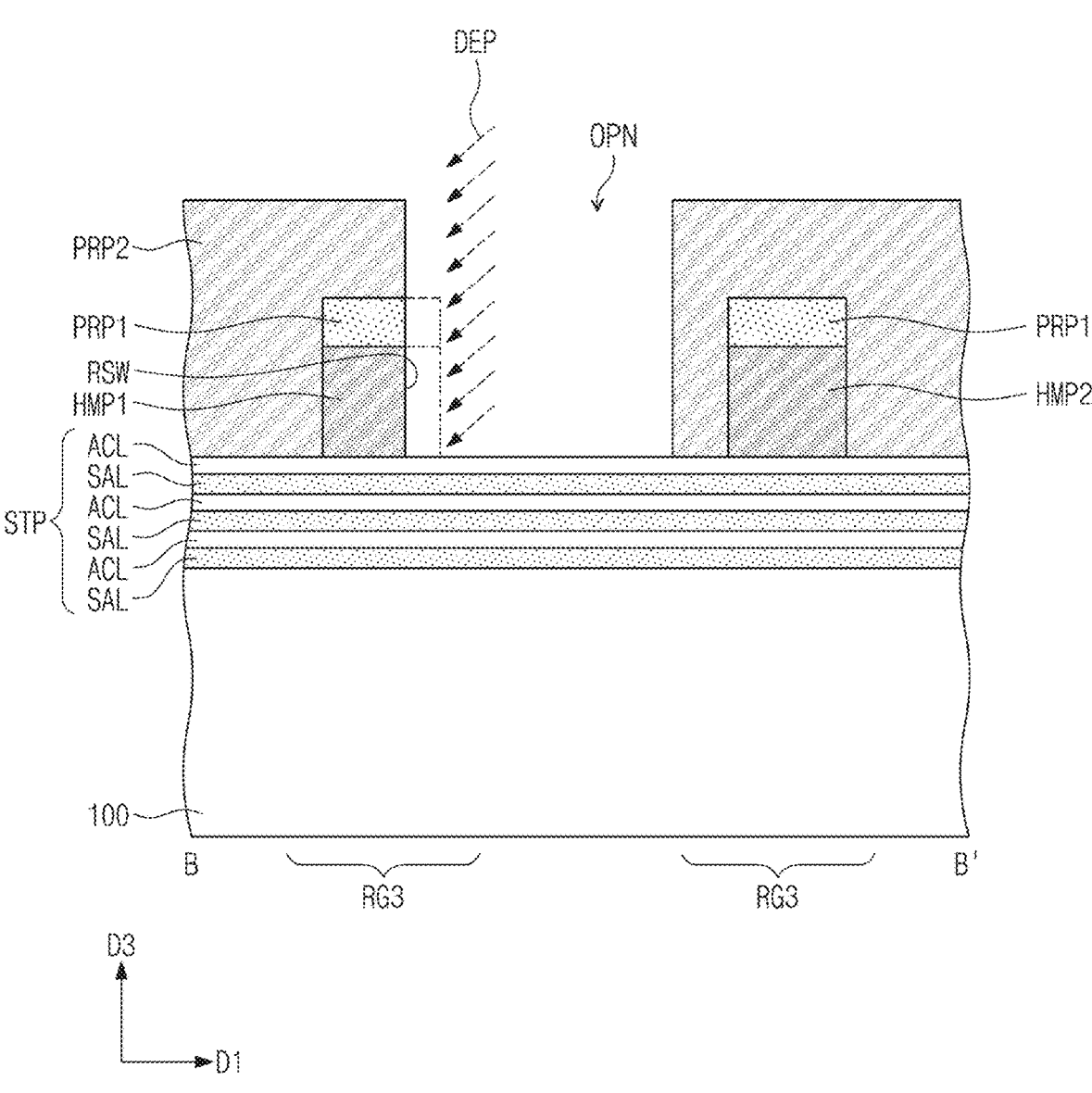

Referring to FIGS. 9, 10A, and 10B, a second photoresist pattern PRP2 may be formed on the first and second hardmask patterns HMP1 and HMP2. In various example embodiments, the second photoresist pattern PRP2 may be formed through an extreme ultraviolet (EUV) lithography process. The second photoresist pattern PRP2 may include an opening OPN that partially exposes the third region RG3 of the first hardmask pattern HMP1. For example, the opening OPN may be formed to have an inclination angle of about 45°. The opening OPN may expose the inclined sidewall ISW of the first hardmask pattern HMP1.

A partial etching may be performed on the third region RG3 of the first hardmask pattern HMP1 exposed through the opening OPN. Thus, a recessed sidewall RSW having a recessed profile may be formed on the third region RG3 of the first hardmask pattern HMP1. In contrast, the inclined surface ISW of the second hardmask pattern HMP2 may remain because the third region RG3 of the second hardmask pattern HMP2 is not be exposed.

In various example embodiments, the etching process performed on the third region RG3 may include an elongation etching process DEP. The elongation etching process DEP may be an etching process having directionality parallel to a major axis of the opening OPN. Thus, it may be possible to more clearly form the recessed sidewall RSW that is depressed to a lower portion of the first hardmask pattern HMP1.

Figure 11:
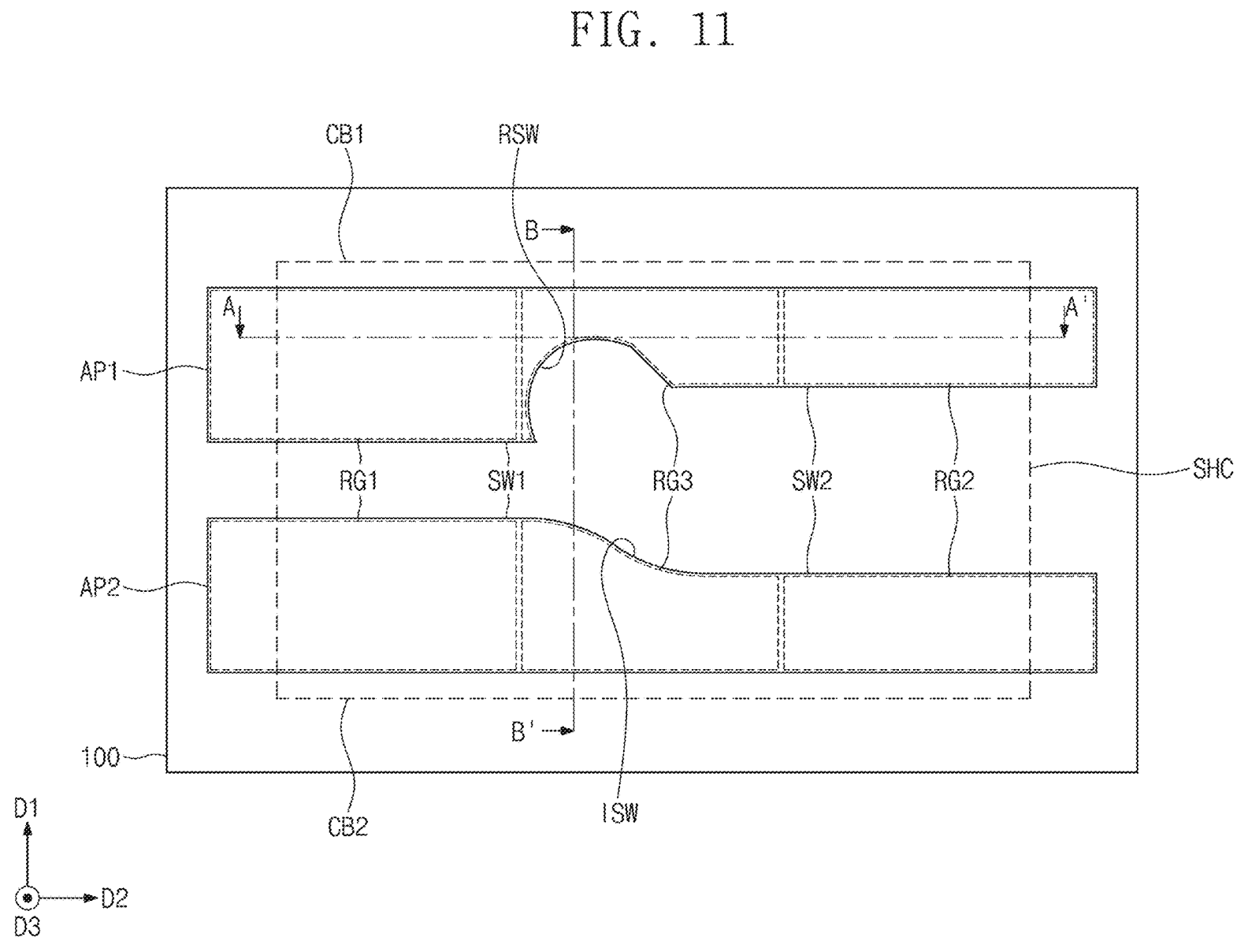
Figure 12A:
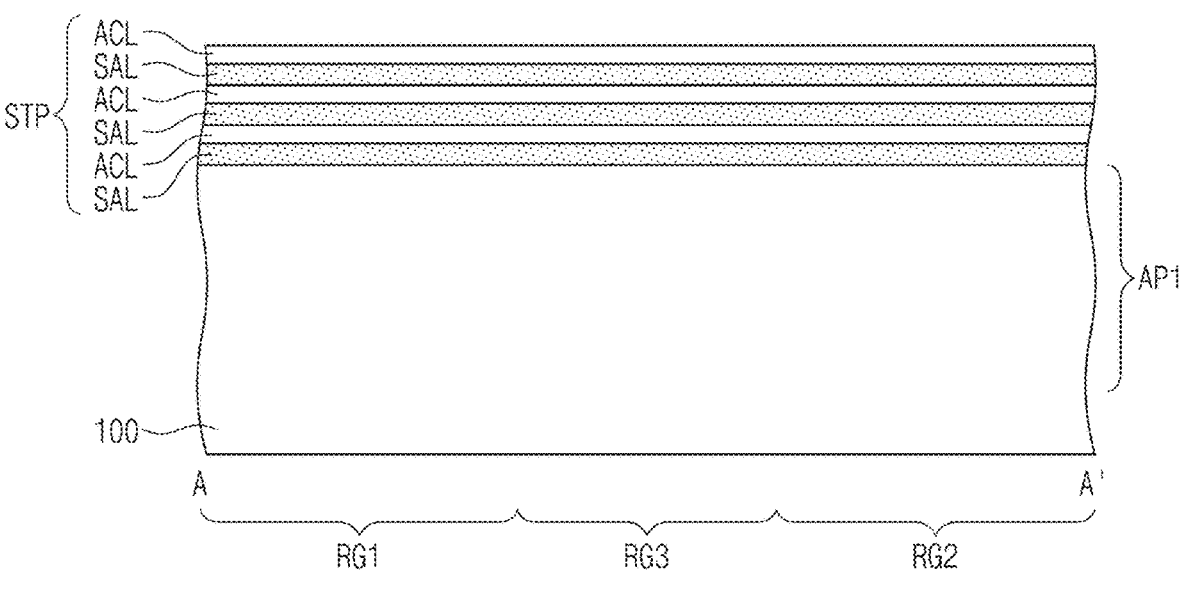
Figure 12B:
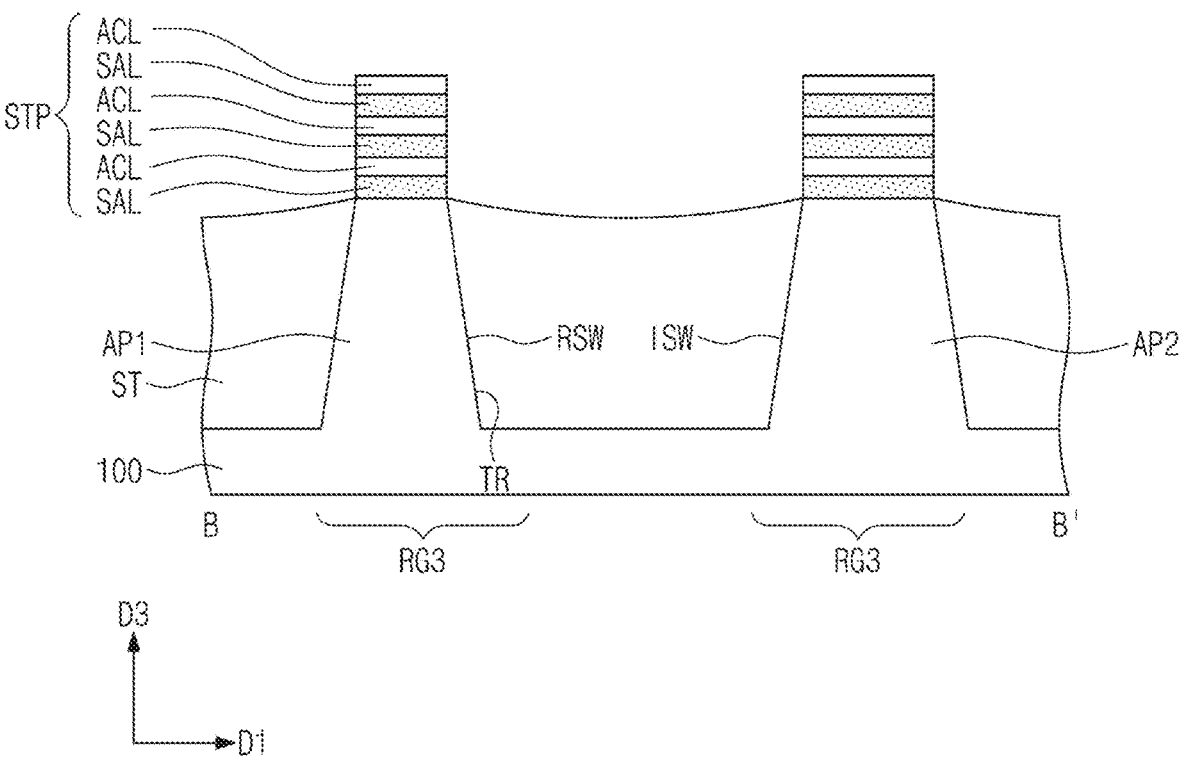

Referring to FIGS. 11, 12A, and 12B, a patterning process may be performed in which the first and second hardmask patterns HMP1 and HMP2 are used as an etching mask to respectively form a first active pattern AP1 and a second active pattern AP2. In an embodiment, the first active pattern AP1 and the second active pattern AP2 may respectively be a PMOSFET region and an NMOSFET region.

A stack pattern STP may be formed on each of the first and second active patterns AP1 and AP2. The stack pattern STP may include the sacrificial layers SAL and the active layers ACL that are alternately stacked with each other. During the patterning process, the stack layer STL may be patterned to form the stack pattern STP.

Each of the first and second active patterns AP1 and AP2 may include the first region RG1 having a first width W1, the second region RG2 having a second width W2, and the third region RG3 between the first and second regions RG1 and RG2. The third region RG3 may be an intermediate region where the first width W1 of the first region RG1 is changed into the second width W2 of the second region RG2. As discussed above, the recessed sidewall RSW that is concavely shaped may be formed on the third region RG3 of the first active pattern AP1. The stack patterns STP may be formed to have substantially the same planar shapes that correspondingly correspond to the first and second active patterns AP1 and AP2.

A device isolation layer ST may be formed to fill a trench TR between the first and second active patterns AP1 and AP2. For example, a dielectric layer may be formed on an entire surface of the substrate 100 to cover the stack patterns STP and the first and second active patterns AP1 and AP2. The dielectric layer may be recessed until the stack patterns STP are exposed, and thus the device isolation layer ST may be formed.

The device isolation layer ST may include a dielectric material, such as a silicon oxide layer. The stack patterns STP may be exposed upwardly from the device isolation layer ST. For example, the stack patterns STP may vertically protrude upwardly from the device isolation layer ST.

Referring to FIGS. 13 and 14A to 14C, a plurality of sacrificial patterns PP may be formed on the substrate 100. The sacrificial patterns PP may run across the stack patterns STP. Each of the sacrificial patterns PP may be formed to have a linear or bar shape that extends in a first direction D1. The sacrificial patterns PP may be arranged at a regular pitch along a second direction D2. For example, the sacrificial patterns PP may include polysilicon.

The formation of the sacrificial patterns PP may include forming a sacrificial semiconductor layer on an entire surface of the substrate 100, forming mask patterns MP on the sacrificial semiconductor layer, and using the mask patterns MP as an etching mask to etch the sacrificial semiconductor layer.

Referring to FIG. 17A, the sacrificial pattern PP on the third region RG3 of the first active pattern AP1 may be formed to have a regular line-width. For example, the line-width of the sacrificial pattern PP may be uniformly formed even on a location in contact with the recessed sidewall RSW.

In contrast, referring to FIG. 17B, the sacrificial pattern PP on the third region RG3 of the second active pattern AP2 may include a skirt portion SKT that is formed to have a line-width that abruptly increases. The skirt portion SKT may be in contact with the inclined sidewall ISW.

According to some example embodiments, on an active pattern on which the recessed sidewall RSW is formed, a concave profile of the recessed sidewall RSW may cause that the sacrificial pattern PP is formed to form a regular line-width. In contrast, on an active pattern on which the inclined sidewall ISW is formed, a convex profile of the inclined sidewall ISW may cause that the skirt portion SKT is formed on the sacrificial pattern PP.

According to the various example embodiments, an additional photolithography process (or the second photoresist pattern PRP2 of FIG. 9) may be used to selectively form the recessed sidewall RSW on the third region RG3. As the additional photolithography process is used, it may be possible to more easily control a size of and/or a degree of concavity (or a radius-of-curvature) of the recessed sidewall RSW.

Referring to FIGS. 15 and 16A to 16D, a pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include at least one selected from SiCN, SiCON, and SiN.

First recesses RS1 may be formed in the stack pattern STP on the first active pattern AP1. Second recesses RS2 may be formed in the stack pattern STP on the second active pattern AP2. During the formation of the first and second recesses RS1 and RS2, the device isolation layer ST may further be recessed on opposite sides of each of the first and second active patterns AP1 and AP2 (see FIG. 16D).

The mask patterns MP and the gate spacers GS may be used as an etching mask to etch the stack pattern STP on the first active pattern AP1, thereby forming the first recesses RS1. The first recess RS1 may be formed between a pair of sacrificial patterns PP. The second recesses RS2 in the stack pattern STP on the second active pattern AP2 may be formed by the same method used for the formation of the first recesses RS1.

The active layers ACL may be formed into first, second, and third semiconductor patterns SP1, SP2, and SP3 that are sequentially stacked between neighboring first recesses RS1. The active layers ACL may be formed into first, second, and third semiconductor patterns SP1, SP2, and SP3 that are sequentially stacked between neighboring second recesses RS2. A first channel pattern CH1 may be constituted by the first, second, and third semiconductor patterns SP1, SP2, and SP3 between neighboring first recesses RS1. A second channel pattern CH2 may be constituted by the first, second, and third semiconductor patterns SP1, SP2, and SP3 between neighboring second recesses RS2.

First source/drain patterns SD1 may be correspondingly formed in the first recesses RS1. For example, a first selective epitaxial growth (SEG) process may be performed in which an inner wall of the first recess RS1 is used as a seed layer to form the first source/drain pattern SD1. The first SEG process may include chemical vapor deposition (CVD) and/or molecular beam epitaxy (MBE).

The first source/drain pattern SD1 may include a semiconductor element (e.g., SiGe) whose lattice constant is greater than that of a semiconductor element of the substrate 100. Impurities may be in-situ implanted during the first SEG process. Alternatively, after the first source/drain pattern SD1 is formed, impurities may be doped into the first source/drain pattern SD1. The first source/drain pattern SD1 may be doped to have a first conductivity type (e.g., p-type).

Second source/drain patterns SD2 may be correspondingly formed in the second recesses RS2. For example, a second selective epitaxial growth (SEG) process may be performed in which an inner wall of the second recess RS2 is used as a seed layer to form the second source/drain pattern SD2. For example, the second source/drain pattern SD2 may include the same semiconductor element (e.g., Si) as that of the substrate 100. The second source/drain pattern SD2 may be doped to have a second conductivity type (e.g., n-type). Inner spacers IP may be correspondingly formed between the second source/drain pattern SD2 and the sacrificial layers SAL.

Referring back to FIGS. 4 and 5A to 5E, a first interlayer dielectric layer 110 may be formed to cover the first and second source/drain patterns SD1 and SD2, the hardmask patterns MP, and the gate spacers GS. For example, the first interlayer dielectric layer 110 may include a silicon oxide layer. The first interlayer dielectric layer 110 may be planarized until top surfaces of the sacrificial patterns PP are exposed. An etch-back and/or a chemical mechanical polishing (CMP) process may be employed to planarize the first interlayer dielectric layer 110. The mask patterns MP may all be removed during the planarization process.

The sacrificial patterns PP may be replaced with gate electrodes GE. For example, the exposed sacrificial patterns PP may be selectively removed. The sacrificial pattern PP may be removed to expose the sacrificial layers SAL. The exposed sacrificial layers SAL may be selectively removed. A gate dielectric layer GI and the gate electrode GE may be sequentially formed in an area where the sacrificial pattern PP and the sacrificial layers SAL are removed. The gate dielectric layer GI may surround each of the first, second, and third semiconductor patterns SP1, SP2, and SP3. A gate capping pattern GP may be formed on the gate electrode GE.

The gate electrode GE may include first, second, and third inner electrodes PO1, PO2, and PO3 that are correspondingly formed in areas where the sacrificial layers SAL are removed. The gate electrode GE may further include an outer electrode PO4 formed in an area where the sacrificial pattern PP is removed.

A second interlayer dielectric layer 120 may be formed on the first interlayer dielectric layer 110. The second interlayer dielectric layer 120 may include a silicon oxide layer. A pair of separation structures DB may be formed on opposite sides of the single height cell SHC. The separation structure DB may extend from the second interlayer dielectric layer 120 through the gate electrode GE into the active pattern AP1 or AP2. The separation structure DB may include a dielectric material, such as a silicon oxide layer or a silicon nitride layer.

Active contacts AC may be formed to penetrate the first and second interlayer dielectric layers 110 and 120 to be correspondingly coupled to the first and second source/drain patterns SD1 and SD2. Gate contacts GC may be formed to penetrate the second interlayer dielectric layer 120 and the gate capping pattern GP to be correspondingly coupled to the gate electrodes GE.

A third interlayer dielectric layer 130 may be formed on the active contacts AC and the gate contacts GC. A first metal layer M1 may be formed in the third interlayer dielectric layer 130. A fourth interlayer dielectric layer 140 may be formed on the third interlayer dielectric layer 130. A second metal layer M2 may be formed in the fourth interlayer dielectric layer 140.

Figure 18:
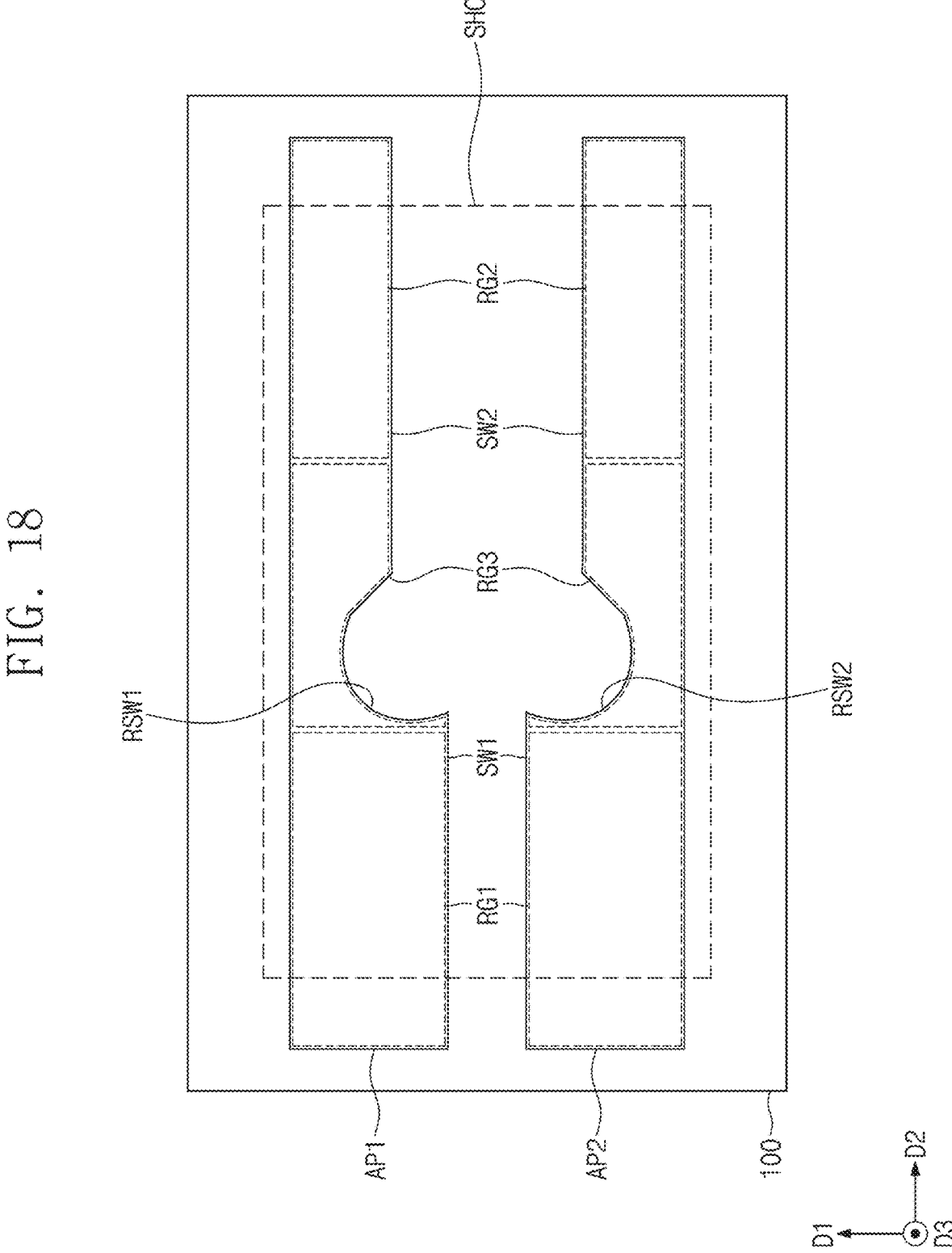
FIG. 18 illustrates a plan view showing a semiconductor device according to some example embodiments.

FIG. 18 illustrates a plan view showing a semiconductor device according to some example embodiments. In the embodiment that follows, a detailed description of technical features repetitive to those discussed above with reference to FIGS. 4 and 5A to 5E will be omitted, and a difference thereof will be discussed in detail.

Referring to FIG. 18, the third region RG3 of the first active pattern AP1 may have a first recessed sidewall RSW1, and the third region RG3 of the second active pattern AP2 may have a second recessed sidewall RSW2. For example, the first active pattern AP1 and the second active pattern AP2 may be mirror-symmetric to each other.

As the third region RG3 of the second active pattern AP2 has the second recessed sidewall RSW2, the skirt portion SKT discussed above with reference to FIG. 6B may not be formed on the second active pattern AP2.

According to some example embodiments, the recessed sidewall RSW may be formed, if necessary, on the third region RG3 that is a transition region. The recessed sidewall RSW may be formed on a PMOSFET region, an NMOSFET region, or both of PMOSFET and NMOSFET regions. The recessed sidewall RSW may be formed on a transition region where the formation of the skirt portion SKT is not desired on the gate electrode GE, and thus the skirt portion SKT may be prevented from being formed on the transition region.

In a semiconductor device according to various example, a sidewall that is recessed at least in plan view may be formed on a transition region where an active pattern has a variable width. Therefore, a skirt portion may be prevented from being formed on a gate electrode formed on the transition region. As a result, the present inventive concepts prevent process failure such as fracture of a source/drain pattern to allow a semiconductor device to have increased reliability.

Although some embodiments of inventive concepts have been discussed with reference to accompanying figures, it will be understood that various changes in form and details may be made therein without departing from the spirit and scope of inventive concepts. It therefore will be understood that the embodiments described above are just illustrative but not limitative in all aspects. Additionally, example embodiments are not necessarily mutually exclusive with one another. For example, some example embodiments may include one or more features described with reference to one or more drawings, and may also include one or more other features described with reference to one or more other drawings.

What is claimed is:

1. A semiconductor device, comprising:

an active pattern on a substrate;

a plurality of source/drain patterns on the active pattern;

a plurality of channel patterns on the active pattern and connected to the plurality of source/drain patterns, each of the plurality of channel patterns including a plurality of semiconductor patterns that are vertically stacked and spaced apart from each other;

a plurality of gate electrodes correspondingly on the plurality of channel patterns, the plurality of gate electrodes extending in parallel to each other in a first direction; and a power line adjacent to the active pattern, wherein the power line extends in a second direction that intersects the first direction, the active pattern includes a first region having a first width, a second region having a second width less than the first width, and a third region between the first region and the second region, the first region has a first sidewall that extends in the second direction, the second region has a second sidewall that extends in the second direction, the third region has a recessed sidewall that connects the first sidewall and the second sidewall to each other, and the recessed sidewall is recessed toward the power line.

2. The semiconductor device of claim 1, wherein a third width of the third region decreases and then increases in a direction from the first region toward the second region.

3. The semiconductor device of claim 1, wherein the plurality of gate electrodes include a first gate electrode on the recessed sidewall of the third region.

4. The semiconductor device of claim 3, wherein
the plurality of gate electrodes further include a second
gate electrode on the third region,
the third region has a third width on one side of the first
gate electrode, a fourth width on another side of the first
gate electrode, and a fifth width on one side of the
second gate electrode,
the third width is greater than the fourth width, and
the fifth width is greater than the fourth width.

5. The semiconductor device of claim 1, wherein
one of the plurality of channel patterns that is on the third
region includes a first lateral surface and a second
lateral surface that are opposite to each other in the first
direction,
the first lateral surface is defined by the recessed sidewall,
and
the second lateral surface is parallel to the second direc-
tion.

6. The semiconductor device of claim 5, wherein the first
lateral surface is recessed toward the power line.

7. The semiconductor device of claim 1, wherein each of
the plurality of gate electrodes includes:
a plurality of inner electrodes between the plurality of
semiconductor patterns; and
an outer electrode on the plurality of semiconductor
patterns.

8. The semiconductor device of claim 1, wherein
the plurality of source/drain patterns include a first source/
drain pattern on the first region, a second source/drain
pattern on the second region, and a third source/drain
pattern on the third region,
a width in the first direction of the first source/drain
pattern is greater than a width in the first direction of
the second source/drain pattern, and
a width in the first direction of the third source/drain
pattern is same as or less than the width in the first
direction of the second source/drain pattern.

9. The semiconductor device of claim 1, wherein
the plurality of channel patterns include a first channel
pattern on the first region, a second channel pattern on
the second region, and a third channel pattern on the
third region,
a width in the first direction of the first channel pattern is
greater than a width in the first direction of the second
channel pattern, and
a width in the first direction of the third channel pattern is
less than the width in the first direction of the second
channel pattern.

10. The semiconductor device of claim 1, wherein the
active pattern is included in a PMOSFET region.

11. A semiconductor device, comprising:
a first active pattern on a substrate and a second active
pattern on the substrate, each of the first and second
active patterns including a first region having a first
width, a second region having a second width less than
the first width, and a third region between the first
region and the second region;
a first source/drain pattern on the third region of the first
active pattern and a first channel pattern on the third
region of the first active pattern;
a second source/drain pattern on the third region of the
second active pattern and a second channel pattern on
the third region of the second active pattern; and
a gate electrode on the first channel pattern and the second
channel pattern, wherein
the gate electrode extends in a first direction from the
second active pattern to the first active pattern, the third region of the first active pattern has a recessed
sidewall of a concave profile, and
the third region of the second active pattern has an
inclined sidewall of a convex profile.

12. The semiconductor device of claim 11, wherein a
width in the first direction of the first source/drain pattern is
less than a width in the first direction of the second source/
drain pattern.

13. The semiconductor device of claim 11, wherein a
width in the first direction of the first channel pattern is less
than a width in the first direction of the second channel
pattern.

14. The semiconductor device of claim 11, wherein
the first channel pattern includes a first lateral surface
defined by the recessed sidewall,
the second channel pattern includes a second lateral
surface defined by the inclined sidewall, and
a width of the gate electrode adjacent to the first lateral
surface is less than a width of the gate electrode
adjacent to the second lateral surface.

15. The semiconductor device of claim 14, wherein the
gate electrode includes a skirt portion adjacent to the second
lateral surface.

16. A semiconductor device, comprising:
an active pattern on a substrate;
a device isolation layer that at least partly fills a trench
defining the active pattern;
a source/drain pattern on the active pattern;
a channel pattern on the active pattern and connected to
the source/drain pattern, the channel pattern including
a plurality of semiconductor patterns that are vertically
stacked and spaced apart from each other;
a gate electrode on the channel pattern, the gate electrode
extending in a first direction and including a plurality of
inner electrodes between the plurality of semiconductor
patterns and an outer electrode on the plurality of
semiconductor patterns;
a gate dielectric layer between the gate electrode and the
channel pattern;
a gate spacer on a sidewall of the gate electrode;
a gate capping pattern on a top surface of the gate
electrode;
an interlayer dielectric layer on the gate capping pattern;
an active contact that penetrates the interlayer dielectric
layer to come into electrical connection with the
source/drain pattern;
a metal-semiconductor compound layer between the
active contact and the source/drain pattern;
a gate contact that penetrates the interlayer dielectric layer
and the gate capping pattern and comes into electrical
connection with the gate electrode;
a first metal layer on the interlayer dielectric layer, the first
metal layer including a plurality of first wiring lines
that are correspondingly electrically connected to the
active contact and the gate contact; and
a second metal layer on the first metal layer, wherein
the second metal layer includes a plurality of second
wiring lines electrically connected to the first metal
layer,
the active pattern includes a first region having a first
width, a second region having a second width less than
the first width, and a third region between the first
region and the second region, and
a third width of the third region decreases and then
increases in a direction from the first region toward the
second region.

17. The semiconductor device of claim 16, wherein
the first region has a first sidewall that extends in a second
    direction,
the second region has a second sidewall that extends in the
    second direction, and
the third region has a recessed sidewall that connects the
    first sidewall and the second sidewall to each other.
18. The semiconductor device of claim 16, wherein
the gate electrode includes a first gate electrode and a
    second gate electrode that are on the third region,
the first gate electrode is adjacent to the first region,
the second gate electrode is adjacent to the second region,
    and
the third width of the third region between the first and
    second gate electrodes is less than the second width.
19. The semiconductor device of claim 16, wherein
the source/drain pattern includes a first source/drain pat-
    tern on the first region, a second source/drain pattern on
    the second region, and a third source/drain pattern on
    the third region,
a width in the first direction of the first source/drain
    pattern is greater than a width in the first direction of
    the second source/drain pattern, and
a width in the first direction of the third source/drain
    pattern is the same as or less than the width in the first
    direction of the second source/drain pattern.
20. The semiconductor device of claim 16, wherein the
active pattern is included in a PMOSFET region.

* * * * *